(12) United States Patent
Yamamoto

(10) Patent No.: US 7,601,440 B2
(45) Date of Patent: Oct. 13, 2009

(54) HARD COATING EXCELLENT IN WEAR RESISTANCE AND IN OXIDATION RESISTANCE AND TARGET FOR FORMING THE SAME

(75) Inventor: Kenji Yamamoto, Kobe (JP)

(73) Assignee: Kabushiki Kaisha Kobe Seiko Sho (Kobe Steel, Ltd.), Kobe-shi (JP)

( * ) Notice: Subject to any disclaimer, the term of this patent is extended or adjusted under 35 U.S.C. 154(b) by 0 days.

(21) Appl. No.: 12/362,016

(22) Filed: Jan. 29, 2009

(65) Prior Publication Data

US 2009/0136727 A1    May 28, 2009

Related U.S. Application Data

(62) Division of application No. 11/237,798, filed on Sep. 29, 2005, now Pat. No. 7,521,131.

(30) Foreign Application Priority Data

Sep. 30, 2004   (JP) ............................. 2004-288042
Aug. 26, 2005   (JP) ............................. 2005-246660

(51) Int. Cl.
    *B32B 9/00* (2006.01)
(52) U.S. Cl. .................. 428/697; 428/698; 428/699
(58) Field of Classification Search .......... 428/697, 428/698, 699
    See application file for complete search history.

(56) References Cited

U.S. PATENT DOCUMENTS

| 4,714,660 | A | 12/1987 | Gates, Jr. |
| 5,981,049 | A | 11/1999 | Ohara et al. |
| 6,329,275 | B1 | 12/2001 | Ishigami et al. |
| 6,602,390 | B1 | 8/2003 | Brandle et al. |
| 6,824,601 | B2 | 11/2004 | Yamamoto et al. |
| 7,083,868 | B2 | 8/2006 | Horling et al. |
| 7,144,547 | B2 | 12/2006 | Yamamoto et al. |
| 2004/0115484 | A1 | 6/2004 | Horling et al. |

FOREIGN PATENT DOCUMENTS

| EP | 0 855 451 A1 | 7/1998 |
| EP | 1 219 723 A2 | 7/2002 |
| EP | 1 348 776 A1 | 10/2003 |
| EP | 1 422 311 A2 | 5/2004 |

(Continued)

OTHER PUBLICATIONS

U.S. Appl. No. 12/354,355, filed Jan. 15, 2009, Yamamoto.

(Continued)

*Primary Examiner*—Archene Turner
(74) *Attorney, Agent, or Firm*—Oblon, Spivak, McClelland, Maier & Neustadt, L.L.P.

(57) ABSTRACT

A hard coating superior in wear resistance and in oxidation resistance and also a hard coating superior in high-temperature anti-friction performance and oxidation resistance over the conventional coating film are provided.

One of the typical hard coating excellent in wear resistance and oxidation resistance, which comprises a composition represented by the formula: $(Al_a, M_b, Cr_{1-a-b})(C_{1-e}N_e)$ (where M represents W and/or Mo, a, b and e that represent atomic ratios of Al, M and N, respectively, satisfy the following relations):

$0.25 \leq a \leq 0.65,$ $0.05 \leq b \leq 0.35,$ and $0.5 \leq e \leq 1.$

4 Claims, 4 Drawing Sheets

FOREIGN PATENT DOCUMENTS

| | | |
|---|---|---|
| JP | 3-120354 | 5/1991 |
| JP | 08 120445 A | 5/1996 |
| JP | 09 003635 A | 1/1997 |
| JP | 9-323204 | 12/1997 |
| JP | 10-18024 | 1/1998 |
| JP | 10-237628 | 9/1998 |
| JP | 2000-325108 | 11/2000 |
| JP | 2000-326108 | 11/2000 |
| JP | 2002-254208 | 9/2002 |
| JP | 2003-211305 | 7/2003 |
| JP | 2004-100004 | 4/2004 |
| JP | 2004-130514 | 4/2004 |

OTHER PUBLICATIONS

Kenji Yamamoto, et al., "Properties of nano-multilayered hard coating deposited by a new hybrid coating process: combined cathodic arc and unbalanced magnetron sputtering", Surface and Coatings Technology 200, 2005, pp. 435-439.

Film forming apparatus

HARD COATING EXCELLENT IN WEAR RESISTANCE AND IN OXIDATION RESISTANCE AND TARGET FOR FORMING THE SAME

BACKGROUND OF THE INVENTION

1. Field of the Invention

The present invention relates to a hard coating excellent in wear resistance and in oxidation resistance and hard coating excellent in high-temperature anti-friction performance and in oxidation resistance and also a target for forming the hard coating, and particularly to a hard coating that is capable of improving the wear resistance, oxidation resistance and high-temperature anti-friction performance of cutting tools such as throwaway tool tip, drill bit and end mill, and to a target used as an evaporation source in the process of manufacturing the hard coating.

The hard coating of the present invention can be applied to such tools as end mill, drill bit, throwaway tool tip, gear cutting tool such as gear hob, punch-through tool, slitting cutter and plastic processing tools including extrusion die and forging die, that are made by using cemented carbide, cermet, high speed tool steel or the like. In the description that follows, cutting tools will be taken up as typical applications of the present invention.

2. Description of the Related Art

Coating of a tool with a hard coating such as TiN, TiCN or TiAlN has been applied to cutting tools that are used in high speed cutting or cutting of high hardness metals such as quench-hardened steel, for the purpose of improving the wear resistance of the cutting tools made of cemented carbide, cermet or high speed tool steel.

Further in recent years, it has been attempted to improve the properties by adding a third element as well as a tool metal of binary system such as (TiAl)N or (CrAl)N. For example, Japanese Unexamined Patent Publication (Kokai) No. 3-120354, Japanese Unexamined Patent Publication (Kokai) No. 10-18024 and Japanese Unexamined Patent Publication (Kokai) No. 10-237628 describe that excellent characteristics in cutting low-hardness materials such as S50C can be achieved by adding V to the coating material such as (CrAlV)N, (TiAlV)N, (CrAlV) (CN) or (TiAlV) (CN). However, these coating materials do not show sufficient cutting performance in machining of high-hardness materials such as quenched SKD material, and cannot satisfactorily allow it to increase the cutting speed. Thus a coating material having higher hardness and better wear resistance has been called for.

Japanese Unexamined Patent Publication (Kokai) No. 9-323204 describes a multi-layer coating film comprising layers made of Ti, Al and a nitride or carbonitride of a third component, the third component being at least one of Zr, Hf, Cr, W, Y, Si, Ce and Nb, while content of the third component is set in a range from 0.1 to 50% by the atomic ratio to Ti and Al. Japanese Unexamined Patent Publication (Kokai) No. 2004-130514 discloses a coating material having such a constitution that part of Cr atoms of (CrAlSi) (NBCO) are substituted with atoms of at least one of elements of groups 4, 5 and 6a and Y (substitution ratio is not higher than 30 atomic %). However, those proposed as the elements of groups 4, 5 and 6a and Y are only Ti, Zr and Hf, and addition of these elements is not considered to surely increase the wear resistance.

Japanese Unexamined Patent Publication (Kokai) No. 2004-100004 discloses a coating material represented by the formula: $(Ti_a,W_b)(C_x,N_y)_z$ where molar ratios of the components satisfy the relations $0.6 \leq a \leq 0.94$, $0.06 \leq b \leq 0.4$, $a+b=1$, $0.1 \leq x \leq 0.9$, $0.1 \leq y \leq 0.9$, $x+y=1$ and Z (total molar ratio of all non-metallic elements to the total metallic elements) satisfies the relation $0.8 \leq z \leq 1$. As such materials, the following materials are exemplified: (Ti,W)C, (Ti,W,Nb)C, (Ti,W,Ta)C, (Ti,W,Ta,Nb)C, (Ti,W,Al)C, (Ti,W,Si)C, (Ti,W) (C,N), (Ti,W,Nb) (C,N), (Ti,W,Ta) (C,N), (Ti,W,Ta,Nb) (C,N), (Ti,W,Al) (C,N), (Ti,W,Si) (C,N), (Ti,W)N, (Ti,W,Nb)N, (Ti,W,Ta)N, (Ti,W,Ta,Nb)N, (Ti,W,Al)N, (Ti,W,Si)N. It is also described that the coating material represented by the formula: $(Ti_a,W_b,M_c)(C_x,N_y)_z$ where M represents at least one element selected from among Al, Si, Zr, Hf, V, Nb, Ta, Cr and Mo, while molar ratios of the components satisfy the relations $0.6 \leq a \leq 0.94$, $0.06 \leq b \leq 0.4$, $0 \leq c \leq 0.1$, $a+b+c=1$, $0.1 \leq x \leq 0.9$, $0.1 \leq y \leq 0.9$, $x+y=1$ and z (total molar ratio of non-metallic elements C and N to the total metallic elements Ti, W and M) satisfies the relation $0.8 \leq z \leq 1$. In particular, such a constitution as a base material made of a cemented carbide or a coating material includes at least one element selected from among Al, Si, Zr, Hf, V, Nb, Ta, Cr and Mo. However, the coating film that includes W is used only as an intermediate layer that improves the tenacity of the TiN or TiCN and the cemented carbide.

Japanese Unexamined Patent Publication (Kokai) No. 2003-211305 discloses a coating material represented by the formula: $(Ti_{1-x},W_x)(C_{1-y},N_y)$ (where X is from 0.005 to 0.05 and Y is from 0.15 to 0.60 in an atomic ratio). This document describes the action of W by such a statement as "the W component gives high heat resistant plastic deformability to the (Ti, W)CN layer while maintaining the high strength and high toughness of the longitudinally grown crystal structure".

SUMMARY OF THE INVENTION

The present invention is intended to solve the problems described above. An object of the present invention is to provide a hard coating that is superior in wear resistance and in oxidation resistance and also a hard coating that is superior in high-temperature anti-friction performance and in oxidation resistance over the conventional coating film, and a target used for efficient manufacturing of the hard coating.

Therefore, from a first aspect of the present invention, there is provided a hard coating that is excellent in wear resistance and in oxidation resistance which comprises a composition represented by the formula: $(Al_a,M_b,Cr_{1-a-b})(C_{1-e}N_e)$ (where M represents W and/or Mo, a, b and e that represent atomic ratios of Al, M and N, respectively, satisfy the following relations) (this material may be hereinafter referred to as the hard coating (I-1)):

$0.25 \leq a \leq 0.65$, $0.05 \leq b \leq 0.35$, and $0.5 \leq e \leq 1$

Further, according to the present invention, there is also provided a hard coating that is excellent in wear resistance and in oxidation resistance which comprises a composition represented by the formula: $(Al_a,M_b,Si_c,B_d,Cr_{1-a-b-c-d})(C_{1-e}N_e)$ (where M represents W and/or Mo, a, b, c, d and e that represent atomic ratios of Al, M, Si, B and N, respectively, satisfy the following relations) (hereinafter referred to as the hard coating (I-2)):

$0.25 \leq a \leq 0.65$, $0.05 \leq b \leq 0.35$, $0.01 \leq c+d \leq 0.2$, and $0.5 \leq e \leq 1$ Furthermore, according to the present invention, there can be provided a hard coating that is excellent in wear resistance and in oxidation resistance which comprises a composition represented by the formula: $(Al_a,M_b,Si_c,B_d,Ti_{1-a-b-c-d})(C_{1-e}$ $N_e$) (where M represents W and/or Mo, and a, b, c, d and e that represent atomic ratios of Al, M, Si, B and N, respectively, satisfy the following relations)(hereinafter referred to as the hard coating (I-3)):

$0.25 \leq a \leq 0.6$, $0.05 \leq b \leq 0.3$, $0.01 \leq c+d \leq 0.15$, and $0.5 \leq e \leq 1$ From a second aspect of the present invention, there is also provided a target used for forming the hard coating described above, which target is characterized the relative density of 92% or higher.

The target used for forming the hard coating (I-1) described above preferably comprises a composition represented by the formula: $(Al_w, M_x, Cr_{1-w-x})$ where M represents W and/or Mo, and where w and x that represent atomic ratios of Al and M, respectively, satisfy the following relations:

ti $0.25 \leq w \leq 0.65$, and $0.05 \leq x \leq 0.35$

The target used for forming the hard coating (I-2) described above preferably comprises a composition represented by the formula: $(Al_w, M_x, Si_y, B_z, Cr_{1-w-x-y-z})$ where M represents W and/or Mo, and also where w, x, y and z that represent atomic ratios of Al, M, Si and B, respectively, satisfy the following relations:

$0.25 \leq w \leq 0.65$, $0.05 \leq x \leq 0.35$, and $0.01 \leq y+z \leq 0.2$

The target used for forming the hard coating (I-3) described above preferably comprises a composition represented by the formula: $(Al_w, M_x, Si_y, B_z, Ti_{1-w-x-y-z})$ where M represents W and/or Mo, and also w, x, y and z that represent atomic ratios of Al, M, SI and B, respectively, satisfy the following relations:

$0.25 \leq w \leq 0.6$, $0.05 \leq x \leq 0.3$, and $0.01 \leq y+z \leq 0.15$

From a third aspect of the present invention, there is provided a hard coating excellent in high-temperature anti-friction performance and in wear resistance, which comprises a composition represented by the formula: $(Ti_a, Cr_b, Al_c, Si_d, B_e, M_{1-a-b-c-d-e})(C_{1-f}N_f)$ where M represents W and/or Mo, and also where a, b, c, d, e and f that represent atomic ratios of Ti, Cr, Al, Si, B and N, respectively, satisfy the following relations (this material may be hereinafter referred to as the hard coating (II-1)):

$0 < a \leq 0.7$, $0 < b \leq 0.7$, $0.25 \leq c \leq 0.75$, $0 \leq d+e \leq 0.2$, $0.03 \leq (1-a-b-c-d-e) \leq 0.35$, and $0.5 \leq f \leq 1$ Further, according to the present invention, there is also another hard coating excellent in high-temperature anti-friction performance and in wear resistance which comprises a composition represented by the formula: $(Ti_a, Cr_b, Al_c, Si_d, B_e, M_{1-a-b-c-d-e})(C_{1-f}N_f)$ where M represents W and/or Mo, and also where a, b, c, d, e and f that represent atomic ratios of Ti, Cr, Al, Si, B and N, respectively, satisfy the following relations (this material may be hereinafter referred to as the hard coating (II-2)):

$0.05 \leq a \leq 0.3$, $0.05 \leq b \leq 0.4$, $0.3 \leq c \leq 0.75$, $0 \leq d+e \leq 0.2$, $0.05 \leq (1-a-b-c-d-e) \leq 0.35$, and $0.5 \leq f \leq 1$ Furthermore, according to the present invention, there is another hard coating excellent in high-temperature anti-friction performance and in wear resistance which comprises a composition represented by $(Ti_a, Cr_b, Al_c, Si_d, B_e, M_{1-a-b-c-d-e})(C_{1-f}N_f)$ (M represents W and/or Mo), where a, b, c, d, e and f that represents atomic ratios of Ti, Cr, Al, Si, B and N, respectively, satisfy the following relations (this material may be hereinafter referred to as the hard coating (II-3)):

$0.05 \leq a \leq 0.3$, $0.05 \leq b \leq 0.4$, $0.3 \leq c \leq 0.75$, $0.01 \leq d+e \leq 0.2$, $0.05 \leq (1-a-b-c-d-e) \leq 0.35$, and $0.5 \leq f \leq 1$ From a fourth aspect of the present invention, the present invention also provides a target used for forming the hard coating, and the target used for forming the hard coating (II-1) described above comprises a composition represented by the formula: $(Ti_v, Cr_w, Al_x, Si_y, B_z, M_{1-v-w-x-y-z})$ where M represents W and/or Mo, and also where v, w, x, y and z that represent atomic ratios of Ti, Cr, Al, Si, and B, respectively, satisfy the following relations, and the relative density thereof being 91% or higher:

$0 < v \leq 0.7$, $0 < w \leq 0.7$, $0.25 \leq x \leq 0.75$, $0 \leq y+z \leq 0.2$, and $0.03 \leq (1-v-w-x-y-z) \leq 0.35$ Further, the target used for forming the hard coating (II-2) comprises a composition represented by the formula: $(Ti_v, Cr_w, Al_x, Si_y, B_z, M_{1-v-w-x-y-z})$ where M represents W and/or Mo, and also where v, w, x, y and z that represent atomic ratios of Ti, Cr, Al, Si, and B, respectively, satisfy the following relations, and the relative density thereof being 91% or higher:

$0.05 \leq v \leq 0.3$, $0.05 \leq w \leq 0.4$, $0.3 \leq x \leq 0.75$, $0 \leq y+z \leq 0.2$, and $0.05 \leq (1-v-w-x-y-z) \leq 0.35$ Furthermore, the target used for forming the hard coating (II-3) has a composition represented by the formula: $(Ti_v, Cr_w, Al_x, Si_y, B_z, M_{1-v-w-x-y-z})$ where M represents W and/or Mo, and also where v, w, x, y and z that represent atomic ratios of Ti, Cr, Al, Si, and B, respectively, satisfy the following relations, and the relative density thereof being 91% or higher:

$0.05 \leq v \leq 0.3$, $0.05 \leq w \leq 0.4$, $0.3 \leq x \leq 0.75$, $0.01 \leq y+z \leq 0.2$, and $0.05 \leq (1-v-w-x-y-z) \leq 0.35$ From a fifth aspect of the present invention, there is provided an another hard coating that is excellent in wear resistance and in oxidation resistance and is made by stacking a layer A and a layer B that have different compositions, wherein the layer A is one selected from a group consisting of: a hard coating having composition of $(Al_a, Cr_{1-a})(C_{1-e}N_e)$ satisfying the relations:

$0.25 \leq a \leq 0.7$ and $0.5 \leq e \leq 1$;

a hard coating having composition of $(Al_a, Si_c, B_d, Cr_{1-a-c-d})(C_{1-e}N_e)$ satisfying the relations:

$0.25 \leq a \leq 0.7$, $0 < c+d \leq 0.2$, and $0.5 \leq e \leq 1$; and a hard coating having composition of $(Al_a, Si_c, B_d, Ti_{1-a-c-d})(C_{1-e}N_e)$ satisfying the relations:

$0.25 \leq a \leq 0.7$, $0 < c+d \leq 0.15$, and $0.5 \leq e \leq 1$;

(where a, c, d and e that represent atomic ratios of Al, Si, B and N, respectively)

and the layer B is a hard coating having composition of $(M_b, Si_c, B_d)(C_{1-e}N_e)$ (M represents W and/or Mo) satisfying the relations:

$0.8 \leq x \leq 1$, and $0 \leq c+d \leq 0.2$;

(where b, c, d and e that represent atomic ratios of M, Si, B and N, respectively)

where the layer A and the layer B are stacked one on another so as to satisfy the following relation (1) (this material may be hereinafter referred to as the hard coating (III)):

0.5 (nm) ≤ (Thickness of layer B) ≤ (Thickness of layer A)    (1)

The present invention also provides a target used for forming the hard coating described above, and the target is characterized the relative density thereof being 92% or higher.

The target used for forming the layer A preferably has a composition selected from a group described below, where w, y and z that represent atomic ratios of Al, Si and B, respectively, satisfy the annexed relations:

$(Al_w, Cr_{1-w})$ $0.25 \leq w \leq 0.7$;

$(Al_w, Si_y, B_z, Cr_{1-w-y-z})$ $0.25 \leq w \leq 0.7$, and $0 < y+z \leq 0.2$; and $(Al_w, Si_y, B_z, Ti_{1-w-y-z})$ $0.25 \leq w \leq 0.7$, and $0 < y+z \leq 0.15$ The layer B is preferably formed by using a target made of a material represented by $(M_x, Si_y, B_z)$ where M represents W and/or Mo), and also where x, y and z that represent atomic ratios M, Si, and B, respectively, satisfy the following relations:

$0.8 \leq x \leq 1$, and $0 \leq y+z \leq 0.2$

The present invention, with the constitutions described above, is capable of providing the hard coating that is superior in wear resistance and in oxidation resistance and also the hard coating that is superior in high-temperature anti-friction performance and in wear resistance over the hard coating of the prior art. The hard coatings enable it to provide cutting tools that demonstrate excellent cutting performance in high speed cutting or cutting of high hardness metals such as quench-hardened steel, and have longer service life.

DESCRIPTION OF THE PREFERRED EMBODIMENTS

Figure 1:
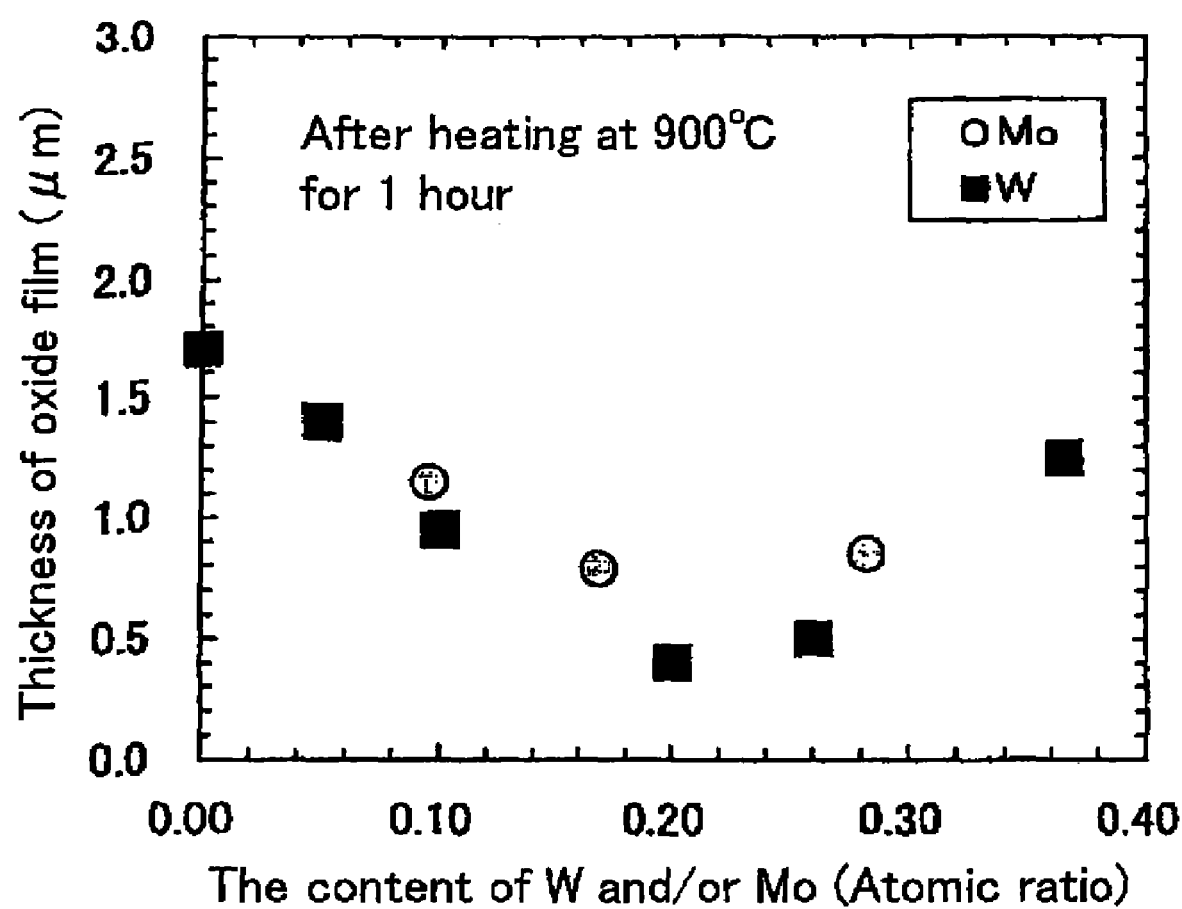
FIG. 1 is a graph showing the relation between the amount of element M (W and/or Mo) added and thickness of the oxide film.

The inventors of the present application conducted a research on a hard coating that has better wear resistance under various situations described above, and reached the following findings.

(I) Oxidation resistance and film hardness can be improved, resulting in dramatically improved wear resistance, by adding W and/or Mo (which may hereinafter be referred to as element M) and further adding Si and/or B to the conventional TiAl (CN) film, CrAl (CN) film that is made by replacing Ti of the TiAl (CN) film with Cr, or Al (CN) film.

(II) The hard coating that is excellent in high-temperature anti-friction performance and in wear resistance is obtained by adding element M (and Si and/or B, as case may be) to the conventional TiCrAl (CN) film.

(III) Better wear resistance and oxidation resistance can be ensured by stacking a film consisting of (element M)(CN) or a film consisting of (element M, Si and/or B)(CN) and a hard coating selected from among a group consisting of AlCr(CN) film, AlSiBCr (CN) film and AlSiBTi (CN) film one on another. In addition to these findings, through a research into quantitative effects of Al, element M, Cr and/or Ti, Si and/or B, C and N, the concept of the present invention was arrived at.

Compositions (I) through (III) of the coating films described above, the method of manufacturing the coating film, the target used in the manufacture of the coating film and the method of manufacturing the target will now be described in detail.

The hard coating of category (I) includes the following variations:

The hard coating (I-1) represented by $(Al_a, M_b, Cr_{1-a-b})(C_{1-e}N_e)$ (M represents W and/or Mo), where a, b and e that represent atomic ratios of Al, M and N, respectively, satisfy the following relations:

$0.25 \leq a \leq 0.65$, $0.05 \leq b \leq 0.35$, and $0.5 \leq e \leq 1$;

The hard coating (I-2) represented by $(Al_a, M_b, Si_c, B_d, Cr_{1-a-b-c-d})(C_{1-e}N_e)$ (M represents W and/or Mo), where a, b, c, d and e that represent atomic ratios of Al, M, Si, B and N, respectively, satisfy the following relations:

$0.25 \leq a \leq 0.65$, $0.05 \leq b \leq 0.35$, $0.01 \leq c+d \leq 0.2$, and $0.5 \leq e \leq 1$; and The hard coating (I-3) represented by $(Al_a, M_b, Si_c, B_d, Ti_{1-a-b-c-d})(C_{1-e}N_e)$ (M represents W and/or Mo), where a, b, c, d and e that represent atomic ratios of Al, M, Si, B and N, respectively, satisfy the following relations:

$0.25 \leq a \leq 0.6$, $0.05 \leq b \leq 0.3$, $0.01 \leq c+d \leq 0.15$, and $0.5 \leq e \leq 1$ The reason for defining the proportions of Al, M, Si, B, Cr, Ti, C and N in the coating material as described above is as follows.

The TiAlN coating of the prior art is formed from crystal having rock salt structure. Replacing Al at the site of Ti in TiN that has rock salt structure so as to turn it into composite nitrides of rock salt structure increases the hardness. However, when the proportion of Al in TiAlN is too high, soft AlN of ZnS type structure precipitates thus decreasing the hardness. It has been known that high hardness can be maintained by substituting Ti in TiAlN with Cr. Through research into a method to obtain a coating film that has higher hardness than the CrAlN coating, the inventors of the present application found that it is made possible to form a hard coating having excellent oxidation resistance while maintaining high wear resistance by adding W and/or Mo to the CrAlN or CrAl(CN) coating film in a proportion within the range described above. The reason for specifying the proportions of the components will be described below.

Upon studying the amount of element M (W and/or Mo) added to the (Al, M, Cr) (CN) coating film to make the hard coating (I-1), it was found that hardness and oxidation resistance can be improved by setting the proportion of element M to 0.05 or higher in an atomic ratio, when the proportions of Al, Cr, C and N are controlled within ranges described below.

FIG. 1 is a graph drawn from data of example to be described later showing the relation between the amount of W and/or Mo added and thickness of oxide film formed by oxidation treatment. From FIG. 1 it can be seen that thickness of oxide film can be controlled within 1.5 μm by setting the proportion of W and/or Mo in a range from 0.05 to 0.35. From FIG. 1 it can also be seen that thickness of oxide film formed by oxidation treatment can be controlled within 1 μm so as to obtain a hard coating that has further better oxidation resistance by setting the proportion of W and/or Mo within a range from 0.15 to 0.25.

Figure 2:
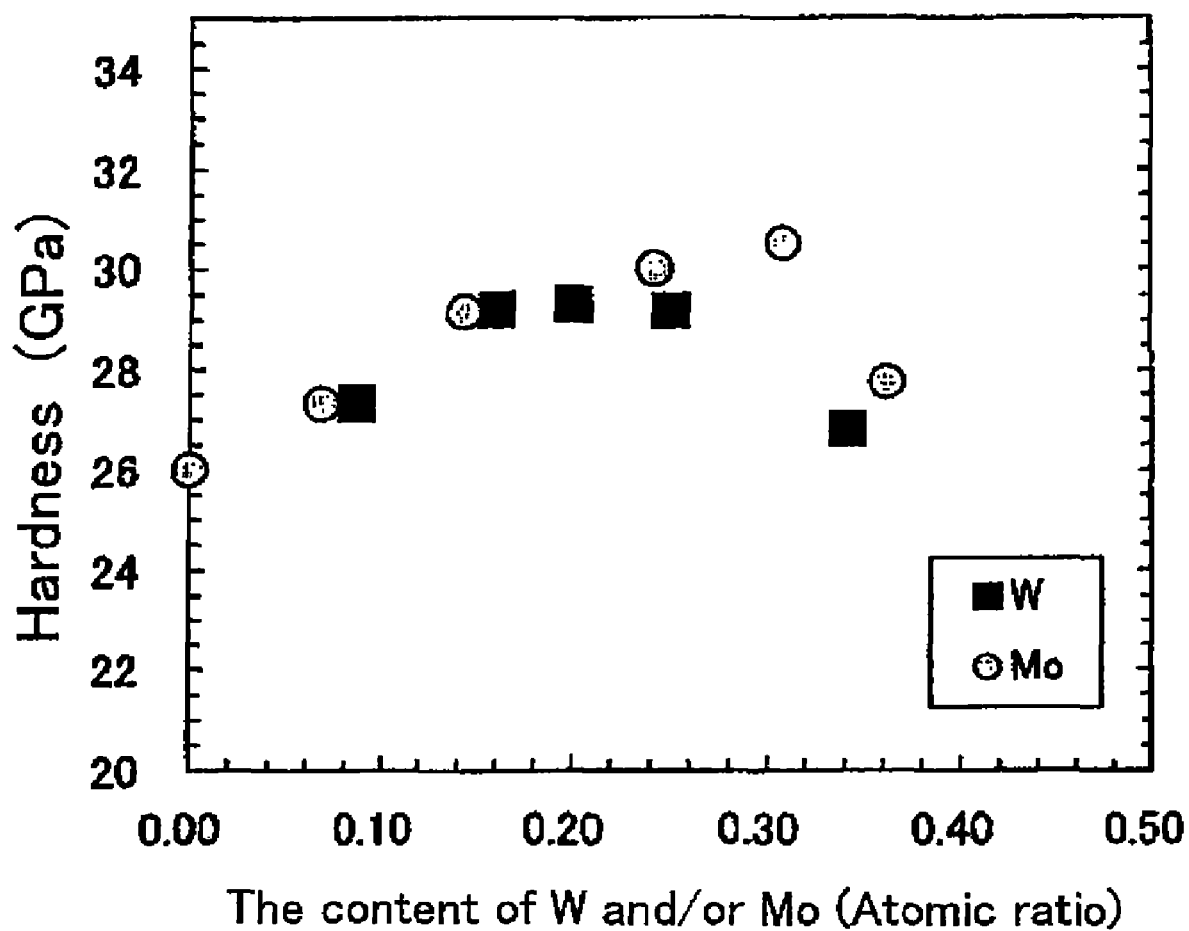
FIG. 2 is a graph showing the relation between the amount of element M (W and/or Mo) added and hardness.

FIG. 2 is a graph drawn from data of example to be described later showing the relation between the amount of W and/or Mo added and hardness of the coating film. From FIG. 2 it can be seen that a high hardness of the coating not lower than 27 GPa can be achieved by setting the proportion of W and/or Mo in a range from 0.05 to 0.35. In order to obtain a higher hardness of the coating not lower than 29 GPa, it is preferable to set the proportion of W and/or Mo in a range from 0.15 to 0.25.

While the mechanism in which wear resistance and oxidation resistance are improved by adding W and/or Mo has not been elucidated, it is considered that hardness of the coating film can be made higher due to the effect of lattice strain generated by substituting the element M; W (lattice constant of $W_2N$ 4.12 Å) and Mo (lattice constant of $Mo_2N$ 4.16 Å), that constitute the nitride having a lattice constant different from that of CrN, with Cr.

As described above, Al has an effect of improving the oxidation resistance. When the proportion of Al is too low, it is difficult to improve the oxidation resistance even when W and/or Mo is added, as shown in FIG. 1. In the present invention, proportion of the number of Al atoms in the total number of Al M and Cr atoms is set to 0.25 or higher, which is preferably 0.3 or higher. While higher Al content helps promote the improvement of the oxidation resistance due to the addition of W and/or Mo, excessively high proportion of Al changes the crystal structure from cubic system (rock salt structure) that has high hardness into hexagonal system (wurtzite structure), resulting in lower hardness. Since a high hardness can be achieved also by the addition of W and/or Mo according to the present invention, proportion of the number of Al atoms is limited to within 0.65. For the purpose of improving the oxidation resistance and hardness at the same time, it is preferable to limit the proportion of the number of Al atoms to less than 0.5.

The content of Cr is determined by the proportion of the numbers of M and Al atoms, and sufficient hardness can be ensured by including Al and W and/or Mo, even when Cr is not included. In order to obtain higher hardness, however, it is preferable to add 0.05 or higher (more preferably 0.1 or higher) content of Cr in terms of the proportion of the number of atoms.

According to the present invention, it was also found that further better oxidation resistance can be obtained by adding Si and/or B to the hard coating (I-1), thus arriving at the constitution of the hard coating (I-2). As to the mechanism of improving the oxidation resistance by adding Si and/or B, it is believed that reaction of Si forms a Si oxide that has good protective property on the surface, and reaction of B forms BN compound that has high oxidation resistance in the coating film. In order to achieve such effects, it is necessary to add 0.01 or higher (more preferably 0.03 or higher) Si and/or B. Since adding an excessive amount tends to cause soft hexagonal crystal to precipitate similarly to the case of Al, content of Si and/or B is restricted within 0.02 or less (more preferably 0.1 or less).

The present inventors also found that superior oxidation resistance over the conventional TiAl(CN) film can be achieved with the hard coating (I-3) that is obtained by adding at least one of W and Mo in a proportion within a predetermined range and Si and/or B to the TiAl(CN) film.

Also in the case of the hard coating (I-3), similarly to the cases of the hard coating (I-1) and hard coating (I-2), a coating that is hard to oxidize during the oxidation process and has excellent wear resistance can be obtained by adding W and/or Mo in a proportion not less than 0.05 (preferably not less than 0.15) and not higher than 0.3 (preferably not higher than 0.25).

As to the mechanism in which wear resistance and oxidation resistance of the hard coating (I-3) are improved by adding W and/or Mo, it is considered that, in addition to the improvement of hardness achieved by the high concentration of Al, the effect of lattice strain for further increasing the hardness of the coating is achieved by substituting the element M; W (lattice constant of $W_2N$ 4.12 Å) and Mo (lattice constant of $MO_2N$ 4.16 Å), that constitute the nitride having a lattice constant different from that of TiN, with Ti.

As described above, Al has an effect of improving the oxidation resistance. When the content of Al in the hard coating (I-3) is too low, it is difficult to improve the oxidation resistance shown in FIG. 1 even when W and/or Mo is added. In the present invention, proportion of the number of Al atoms in the total number of Al M and Ti atoms is set to 0.25 or higher. While higher Al content helps the improvement of the oxidation resistance by the addition of W and/or Mo, excessively high Al content changes the crystal structure from cubic system (rock salt structure) that has high hardness into hexagonal system (wurtzite structure), resulting in lower hardness. Accordingly, the proportion is limited to not higher than 0.6. For the purpose of improving the oxidation resistance and hardness at the same time, it is preferable to limit the proportion of the number of Al atoms within a range from 0.3 to 0.55.

The content of Ti is determined by the proportion of the numbers of M and Al atoms, and sufficient hardness can be ensured by including Al and W and/or Mo, even when Ti is not included. In order to obtain higher hardness, however, it is preferable to add 0.05 or higher (more preferably 0.1 or higher) content of Ti in terms of the proportion of the number of atoms.

Oxidation resistance of the hard coating (I-3) can be increased to a level higher than that of the TiAl(CN) film by adding Si and/or B. It is believed that further better oxidation resistance can be achieved as the reaction of Si forms a Si oxide that has good protective property on the surface, and reaction of B forms BN compound that has high oxidation resistance in the coating film as in the case of the hard coating (I-2). In order to achieve such effects, it is necessary to add 0.01 or higher (more preferably 0.03 or higher) proportion of Si and/or B. Since adding an excessive amount of these elements tends to cause soft hexagonal crystal to precipitate similarly to the case of Al, proportion of Si and/or B is restricted within 0.15 or less (more preferably 0.1 or less).

Contents of C and N in the hard coating (I-1) through (I-3) were limited as described above for the following reasons. Hardness of the coating film can be increased through precipitation of carbides that have high hardness such as WC and/or MoC by adding C to the coating material. This can be achieved by adding an amount of C that is comparable to that of W and Mo. Since an excessive amount of C leads to the precipitation of unstable carbide of Al and/or carbide of Cr that can easily react with water and decompose, it is necessary to limit the proportion of the number of C atoms (1-d) to less than 0.5, in other words, limit the proportion of the number of N atoms (d) to not less than 0.5. The proportion of the number of N atoms (d) is preferably not less than 0.7 and more preferably not less than 0.8, while proportion of d=1 is the best.

The hard coating of the present invention preferably mainly composes of substantial rock salt type crystal structure, in order to ensure high strength.

The coating of the present invention may be, in addition to a single-layer coating that satisfies the requirements described above, a stack of a plurality of layers of the same composition that satisfies the requirements described above, or a stack of a plurality of layers of different compositions that satisfy the requirements described above. Depending on the application, the hard coating of the present invention may have, either on one side or both sides thereof, coating film made of metal nitride, metal carbide or metal carbonitride that has rock salt structure of a composition, different from that of the present invention, such as TiN, TiAlN, TiCrAlN, TiCN, TiAlCN, TiCrAlCN or TiC to such an extent as the wear resistance and oxidation resistance are not compromised.

The coating of the present invention, whether it has single-layer or multi-layer structure, has total thickness preferably in a range from 0.5 µm to 20 µm. When the total thickness is less than 0.5 µm, the thin film cannot put the excellent wear resistance into full play. When the total thickness is more than 20 µm, on the other hand, the film may be chipped or come off during cutting operation. The film thickness is more preferably in a range from 1 µm to 15 µm.

While the present invention is not intended to define the method for manufacturing the hard coating, since the coating of the present invention may include elements that have widely different melting temperatures such as W and Al, it is difficult to control the composition by the electron beam vapor deposition or hollow cathode method, and accordingly it is recommended to form the coating film by sputtering method that utilizes a solid vaporization source or by arc ion plating (AIP) method.

When forming a film that includes elements that are widely different not only in the melting temperature but also in atomic weight such as W and Al, composition of the coating film may become different from that of the target if a high pressure is applied during formation of the film. A cause of this trouble may be the scatter of the evaporated atoms and the assisting gas (Ar or $N_2$). To avoid such scattering, it is preferable to control the total pressure to not higher than 3 Pa in the case of AIP method, or not higher than 1 Pa in the case of sputtering method. However, since it becomes difficult to introduce nitrogen into the film when the pressure is too low, partial pressure of the reaction gas is preferably 0.5 Pa or higher in the case of AIP method, or 0.05 Pa or higher in the case of sputtering method.

Bias voltage applied to the base material (workpiece) when forming the film is preferably in a range from 30 to 200 V when forming the film with use of an AIP apparatus. Applying the bias voltage to the base material allows effective ion bombardment onto the base material (workpiece), thus accelerating the formation of AlN film that has rock salt structure. To achieve this effect, it is preferable to apply the bias voltage of 30 V or higher. When the bias voltage is too high, however, the film being formed is etched by the ionized gas resulting in a very low film forming rate. Therefore, the bias voltage is preferably not higher than 200 V.

Temperature of the base material (workpiece) when forming the film is preferably in a range from 300 to 800° C. when forming the film with use of an AIP apparatus. When the hard coating that has been formed has a large residual stress, the film cannot hold firmly onto the base metal and is likely to come off. Since the residual stress in the coating can be reduced by setting the temperature of the base material (workpiece) higher, it is preferable to set the temperature of the base material (workpiece) to 300° C. or higher. When temperature of the base material (workpiece) is higher, the residual stress decreases but too low a residual stress leads to lower compressive strength, which compromises the function of the base material to resist breakage and, at the same time, the base material may deteriorate due to high temperature. Therefore, it is preferable to set the upper limit of temperature of the base material (workpiece) to 800° C.

An effective method of manufacturing the hard coating of the present invention is vapor phase coating such as ion plating or sputtering, wherein a target used as a solid evaporation source is evaporated or ionized and deposited on the workpiece. When the target has unfavorable property, however, stable electric discharge cannot be maintained when forming the film, resulting in such problems as non-uniform composition of the film that is formed. Thus the property of the target used in forming the hard coating of the present invention that has excellent wear resistance was studied, and the following findings were obtained.

It was found that electric discharge could be stabilized when forming the film, and the hard coating of the present invention could be formed efficiently, by using the target having relative density of 92% or higher. When the target has a relative density lower than 92%, such a trouble may occur that satisfactory film cannot be formed due to scatter of the target material. This tendency becomes conspicuous in the case of AIP method that uses a high energy density for the input power. Therefore, when the AIP method is used, relative density of the target is preferably 95% or higher, and more preferably 98% or higher.

In the vapor phase coating method such as AIP, composition of the target that is used determines the composition of the coating that is formed. Therefore, composition of the target is preferably the same as the composition of the coating. Thus when forming the hard coating of the present invention that is high in wear resistance and oxidation resistance has the composition of the hard coating (I-1) represented by $(Al_a, M_b, Cr_{1-a-b})(C_{1-e}N_e)$, it is preferable to use a target made of $(Al_w, M_b, Cr_{1-w-x})$ (M represents W and/or Mo), of the same composition as that of the hard coating to be formed, where w and x that represent atomic ratios of Al and M, respectively, satisfy the following relations:

$0.25 \leq a \leq 0.65$, and $0.05 \leq b \leq 0.35$

When forming the hard coating (I-2) represented by $(Al_a, M_b, Si_c, B_d, Cr_{1-a-b-c-d})(C_{1-e}N_e)$, it is preferable to use a target made of $(Al_w, M_x, Si_y, B_z, Cr_{1-w-x-y-z})$ (M represents W and/or Mo), of the same composition as that of the hard coating to be formed, where w, x, y and z that represent atomic ratios of Al, M, Si and B, respectively, satisfy the following relations:

$0.25 \leq w \leq 0.65$, $0.05 \leq x \leq 0.35$, and $0.01 \leq y+z \leq 0.2$

When forming the hard coating (I-3) represented by $(Al_a, M_b, Si_c, B_d, Ti_{1-a-b-c-d})(C_{1-e}N_e)$, it is preferable to use a target made of $(Al_w, M_x, Si_y, B_z, Ti_{1-w-x-y-z})$ (M represents W and/or Mo), of the same composition as that of the hard coating to be formed, where w, x, y and z that represent atomic ratios of Al, M, Si and B atoms, respectively, satisfy the following relations:

$0.25 \leq w \leq 0.6$, $0.05 \leq x \leq 0.3$, and $0.01 \leq y+z \leq 0.15$

When deviation of the composition distribution of the target is within 0.5% by the number of atoms, composition distribution of the hard coating that is formed can also be made uniform, thus making it possible to form the film stably.

When the target includes much impurities (oxygen, hydrogen, chlorine, copper and magnesium) that inevitably mix in, such impurities are released from the target sporadically in the form of gas when forming the film, thus making it impossible to form the film satisfactorily due to unstable electrical discharge or, in the worst case, breakage of the target. Therefore, it is preferable to control the impurities in the target to 0.3% by weight or less for oxygen, 0.05% by weight or less for hydrogen, 0.2% by weight or less for chlorine, 0.05% by weight or less for copper and 0.03% by weight or less for magnesium.

While the present invention is not intended to specify the method of manufacturing the target, an effective method of making the target of the present invention is, for example, to apply cold isostatic pressing (CIP) or hot isostatic pressing (HIP) to a mixture of Al powder, powder of element M and Cr powder or Ti powder that have been prepared with proper weight proportions and particle size and uniformly mixed in a type V mixer or the like.

When the target is formed by the HIP process, intermetallic compounds of W and Al ($WAl_2$, $WAl_5$, $WAl_4$) tend to be formed. Thus it is necessary to control the temperature so that intermetallic compounds do not precipitate, and it is preferable to carry out the HIP process at a temperature from 450 to 500° C. and under a pressure of 1000 atm. For the purpose of suppressing the precipitation of intermetallic compounds, it is preferable to make the target by the hot forging process. In this case, it is preferable to forge at a temperature from 200 to 300° C. When the forging temperature is set higher, Ti—Al intermetallic compounds that are brittle in nature are formed. Besides the methods described above, hot extrusion method or ultra-high pressure hot press method may also be employed in the manufacture of the target of the present invention.

For the hard coating of category (II), the present invention defines the following variations (II-1) through (II-3):

The hard coating (II-1) represented by $(Ti_a, Cr_b, Al_c, Si_d, B_e, M_{1-a-b-c-d-e})(C_{1-f}N_f)$ (M represents W and/or Mo), where a, b, c, d, e and f that represent atomic ratios of Ti, Cr, Al, Si, B and N, respectively, satisfy the following relations:

$0 < a \leq 0.7$, $0 < b \leq 0.7$, $0.25 \leq c \leq 0.75$, $0 \leq d+e \leq 0.2$, $0.03 \leq (1-a-b-c-d-e) \leq 0.35$, and $0.5 \leq f \leq 1$ The hard coating (II-2) represented by $(Ti_a,Cr_b,Al_c,Si_d,B_e, M_{1-a-b-c-d-e})(C_{1-f}N_f)$ (M represents W and/or Mo), where a, b, c, d, e and f that represent atomic ratios of Ti, Cr, Al, Si, B and N, respectively, satisfy the following relations:

$$0.05 \leq a \leq 0.3,$$

$$0.05 \leq b \leq 0.4,$$

$$0.3 \leq c \leq 0.75,$$

$$0 \leq d+e \leq 0.2,$$

$$0.05 \leq (1-a-b-c-d-e) \leq 0.35 \text{ and}$$

$$0.5 \leq f \leq 1$$

The hard coating (II-3) represented by $(Ti_a,Cr_b,Al_c,Si_d,B_e, M_{4-a-b-c-d-e})(C_{1-f}N_f)$ (M represents W and/or Mo), where a, b, c, d, e and f that represent atomic ratios of Ti, Cr, Al, Si, B, M, C and N, respectively, satisfy the following relations:

$$0.05 \leq a \leq 0.3,$$

$$0.05 \leq b \leq 0.4,$$

$$0.3 \leq c \leq 0.75,$$

$$0.01 \leq d+e \leq 0.2,$$

$$0.05 \leq (1-a-b-c-d-e) \leq 0.35, \text{ and}$$

$$0.5 \leq f \leq 1$$

The reason or setting the proportions of Ti, Cr. Al, Si, B, M, C and N as shown above will be described in detail below.

Through research into a method to obtain a hard coating that has higher wear resistance under the situation described above, the inventors of the present application found that it is made possible to form a coating film that has excellent high-temperature anti-friction performance and shows excellent wear resistance in a high wear application where heat generation from the cutting tool causes high temperature, by adding W and/or Mo to the base of TiCrAlN or TiCrAl(CN).

The mechanism in which addition of W and/or Mo enables it to maintain high-temperature anti-friction performance is supposedly as follows. W and/or Mo in the coating film generates heat through friction during relative movement at a high speed between the cutting tool and the chips or the workpiece, resulting in the formation of oxide. Oxides of W and Mo include $WO_2$ (melting point 1500° C.), $WO_3$ (melting point 1470° C.), $MoO_2$ (melting point 1100° C.) and $MoO_3$ (melting point from 795 to 801° C.). Since melting points of these oxides formed in the sliding surface are near the temperatures of the sliding surface that are reached during cutting operation, the oxides are believed to become soft and show anti-friction property in the range of temperatures of the sliding surface.

In order to achieve the high-temperature anti-friction performance, it is necessary to add W and/or Mo in proportion of at least 0.03 in terms of the number of atoms, preferably 0.05 or higher, and more preferably 0.7 or higher. When excessive amount of W and/or Mo is included, significant oxidation of the coating occurs leading to oxidation wear. Accordingly, upper limit of the W and/or Mo content is set to 0.35 in proportion of the number of atoms, preferably 0.3 or less and more preferably 0.2 or less.

In the hard coating films (II-1) through (II-3), high hardness is achieved by combining the three elements of Ti, Cr and Al. In proportion of the number of atoms, content of Ti is 0 or higher, preferably 0.05 or higher and more preferably 0.1 or higher, and content of Cr is 0 or higher, preferably 0.05 or higher and more preferably 0.1 or higher (contents of Ti and Cr are not set to zero at the same time). When content of Ti and/or Cr in the coating is excessively high, relative content of Al becomes low which decreases the hardness of the coating. Accordingly, upper limits of Ti and Cr contents are both set to 0.7 in proportion of the number of atoms, which are more preferably 0.3 or less for Ti and 0.4 or less for Cr.

In order to prevent hardness of the coating film from decreasing, Al content is set to 0.25 or higher in proportion of the number of atoms, preferably 0.3 or higher and more preferably 0.5 or higher. When the Al content is excessively high, transition of the crystal structure of the coating makes it soft. Therefore, upper limit of Al content is set to 0.75 in proportion of the number of atoms, which is more preferably 0.65 or less.

The content of C is specified for the following reason. It is preferable to add C to the coating material so as to have compounds such as TiC, WC and MoC, since it increases the hardness of the coating. However, adding an excessive amount of C results in the precipitation of C that has not bonded with metal element, and in lower oxidation resistance of the coating. Thus the upper limit of C content (1-f) is set to 0.5.

It is also preferable to add Si and/or B, since it makes the crystal grains of the coating smaller, and increases the hardness of the coating. In order to achieve this effect, it is preferable to add 0.01 or more Si and/or B in proportion of the number of atoms. More preferably the content is 0.03 or higher. However, excessive amount of Si and/or B turns the coating into amorphous state that has lower hardness. Therefore, upper limit of the content is set to 0.2 in proportion of the number of atoms, which is more preferably 0.07 or less.

While the present invention is not intended to specify the method of manufacturing the hard coating, an effective method of forming the hard coating of the present invention that has excellent high-temperature anti-friction performance is the vapor phase coating method. Since the hard coating of the present invention may include elements that have widely different melting temperatures such as W and Al, it is difficult to control the composition by the electron beam vapor deposition or hollow cathode ion plating method among the vapor phase coating methods due to different amounts of vaporized metals caused by the difference in the melting point, making these methods unsuitable for the formation of the hard coating of the present invention. Thus a method suitable for the formation of the hard coating of the present invention is the sputtering method or the arc ion plating (AIP) method where a solid vaporization source is used and a coating film having a composition similar to that of the target is obtained. Among the sputtering methods, unbalanced magnetron sputtering (UBMS) or high-power pulse sputtering that applies greater dose of ions to the base material to be coated is more appropriate.

In the sputtering method, a high voltage of several hundreds of volts is applied to the target, and in the AIP method, a large current of around 100 A is supplied, and therefore stability of the electrical discharge depends heavily on the quality of the target. When the target has a low relative density and includes defects such as voids inside thereof, an abnormal discharge starts at the void. Thus it is necessary to use a dense target that has a high relative density. Accordingly the present invention uses a target having a relative density of 91% or higher (preferably 95% or higher) for the formation of the hard coating. The relative density of the target here refers to the ratio of actual density, determined from the weight and volume of the target, to the theoretical density determined from the constituent phase (pure metal, alloy) of the target.

Since the composition of the target determines the composition of the coating to be formed, composition of the target is preferably the same as the composition of the coating. To form the hard coating (II-1) represented by $(Ti_a, Cr_b, Al_c, Si_d, B_e, M_{1-a-b-c-d-e})(C_{1-f}N_f)$, it is preferable to use a target having the same composition as that of the hard coating to be formed and made of $(Ti_v, Cr_w, Al_x, Si_y, B_z, M_{1-v-w-x-y-z})$ (M represents W and/or Mo), where v, w, x, y and z that represent atomic ratios of Ti, Cr, Al, Si and B, respectively, satisfy the following relations:

$0 < v \leq 0.7$, $0 < w \leq 0.7$, $0.25 \leq x \leq 0.75$, $0 \leq y+z \leq 0.2$, and $0.03 \leq (1-v-w-x-y-z) \leq 0.35$ To form the hard coating represented by $(Ti_a, Cr_b, Al_c, Si_d, B_e, M_{1-a-b-c-d-e})(C_{1-f}N_f)$, it is preferable to use a target having the same composition as that of the hard coating to be formed and made of $(Ti_v, Cr_w, Al_x, Si_y, B_z, M_{1-v-w-x-y-z})$ (M represents W and/or Mo), where v, w, x, y and z that represent atomic ratios of Ti, Cr, Al, Si and B atoms, respectively, satisfy the following relations:

$0.05 \leq v \leq 0.3$, $0.05 \leq w \leq 0.4$, $0.3 \leq x \leq 0.75$ $0 \leq y+z \leq 0.2$, and $0.05 \leq (1-v-w-x-y-z) \leq 0.35$ To form the hard coating (II-3) represented by $(Al_a, M_b, Si_c, B_d, Ti_{1-a-b-c-d})(C_{1-e}N_e)$, it is preferable to use a target having the same composition as that of the hard coating to be formed and made of $(Ti_v, Cr_w, Al_x, Si_y, B_z, M_{1-v-w-x-y-z})$ (M represents W and/or Mo), where v, w, x, y and z that represent atomic ratios of Ti, Cr, Al, Si and B, respectively, satisfy the following relations:

$0.05 \leq v \leq 0.3$, $0.05 \leq w \leq 0.4$, $0.3 \leq x \leq 0.75$ $0.01 \leq y+z \leq 0.2$, and $0.05 \leq (1-v-w-x-y-z) \leq 0.35$ Now turning to the hard coating of category (III), that is made by stacking a layer A and a layer B that have different compositions, wherein the layer A is one selected from a group consisting of: a hard coating having composition of $(Al_a, Cr_{1-a})(C_{1-e}N_e)$ satisfying the relations:

$0.25 \leq a \leq 0.7$, and $0.5 \leq e \leq 1$;

a hard coating having composition of $(Al_a, Si_c, B_d, Cr_{1-a-c-d})(C_{1-e}N_e)$ satisfying the relations:

$0.25 \leq a \leq 0.7$, $0 < c+d \leq 0.2$, and $0.5 \leq e \leq 1$; and a hard coating having composition of $(Al_a, Si_c, B_d, Ti_{1-a-c-d})(C_{1-e}N_e)$ satisfying the relations:

$0.25 \leq a \leq 0.7$, $0 < c+d \leq 0.15$, and $0.5 \leq e \leq 1$;

(where a, c, d and e that represent atomic ratios of Al, Si, B and N, respectively)

the layer B has a composition of $(M_b, Si_c, B_d)(C_{1-e}N_e)$ (M represents W and/or Mo) satisfying the relations:

$0.8 \leq b \leq 1$, and $0 \leq c+d \leq 0.2$;

(where b, c, d and e that represent atomic ratios of M, Si, B and N, respectively)

while the layer A and the layer B are stacked one on another so as to satisfy the following relation (1) (the reason for defining the constitution of the coating will be described later):

$$0.5 \text{ (nm)} \leq \text{(Thickness of layer B)} \leq \text{(Thickness of layer A)} \qquad (1)$$

The inventors of the present application researched into a hard coating that demonstrates excellent cutting performance under harsher conditions in high speed cutting or cutting of high hardness metals such as quench-hardened steel in the situation described previously. The research resulted in a coating that has superior wear resistance and oxidation resistance, made by stacking one (layer A) selected among a group consisting of (Al,Cr)CN, (Al,Cr,Si,B)CN and (Al,Ti,Si,B)CN having composition to be described later, and $(M_b, Si_c, B_d)(C_{1-e}N_e)$ (where M is W and/or Mo) (layer B) having composition to be described later. This excellent performance is supposedly realized through a mechanism described below. While addition of an excessive amount of W and/or Mo to (Al,Cr)CN, (Al,Cr,Si,B)CN or (Al,Ti,Si,B)CN may cause the crystal structure of the coating to turn into soft hexagonal crystal structure, this problem can be solved by stacking a layer A selected among a group consisting of (Al,Cr)CN, (Al,Cr,Si,B)CN and (Al,Ti,Si,B)CN and the layer B made of $(M_b, Si_c, B_d)(C_{1-e}N_e)$ (where M is W and/or Mo) one on another.

However, since the layer B has lower hardness than the layer A, increasing the relative thickness of the layer B leads to lower hardness of the coating, thus canceling the effect described above. According to the present invention, therefore, the layer A and the layer B being stacked so as to satisfy the following relation (1), namely thickness of the layer B is not larger than thickness of the layer A. When the layer B is too thin, property of the layer A dominates the behavior of the coating and the excellent wear resistance and oxidation resistance cannot be achieved. Accordingly, thickness of the layer B is set not less than 0.5 nm (preferably 1.0 nm or larger).

$$0.5 \text{ (nm)} \leq \text{(Thickness of layer B)} \leq \text{(Thickness of layer A)} \qquad (1)$$

Thickness of the layer A is preferably not larger than 100 nm, and the number of layers to be stacked may be varied depending on the thickness.

Al included in the layer A has an effect of improving the oxidation resistance. Since insufficient content of Al makes it difficult to improve the oxidation resistance, Al content in the layer A of the present invention is set to not less than 0.25, preferably not less than 0.3 in proportion of the number of Al atoms. On the other hand, excessively high Al content changes the crystal structure from cubic system (rock salt structure) that has high hardness into hexagonal system (wurtzite structure), resulting in lower hardness. Accordingly, Al content is limited to not higher than 0.7. For the purpose of improving the oxidation resistance and hardness at the same time, it is preferable to limit the proportion of the number of Al atoms to less than 0.5.

It is preferable that Si and/or B is added to the layer A, which shows higher oxidation resistance than a CrAlN coating or a TiAlN coating. Addition of Si and/or B is effective even with a small quantity, but an excessive dose may lead to the precipitation of soft hexagonal crystal system similarly to the case of excessive addition of Al. Therefore, addition of Si and/or B is limited to within 0.2 (preferably within 0.15) in an atomic ratio.

The layer B is constituted mainly from W and/or Mo (element M), and M(CN) may be MoCN, WCN or the like. It is preferable to add Si and/or B in the form of (M, Si and/or B)(CN) such as MoSiCN or WBCN that has better oxidation resistance. In the layer B, too, addition of Si and/or B is effective even with a small quantity, but an excessive dose decreases the hardness due to relatively low content of the element M. Therefore, addition of Si and/or B is preferably limited to within 0.2 (preferably within 0.15) in an atomic ratio.

The reason for specifying the contents of C and N in the layer A and the layer B is as follows. Hardness of the coating can be increased through precipitation of carbides that have high hardness such as TiC, WC and/or MoC by adding C to the coating material. This can be achieved by adding an amount of C that is comparable to that of W and Mo. Since an excessive amount of C leads to the precipitation of unstable carbide of Al and/or carbide of Cr that can easily react with water and decompose, it is necessary to limit the proportion of the number of C atoms (1-d) to less than 0.5, in other words, the proportion of the number of N atoms (d) to not less than 0.5. The proportion of the number of N atoms (d) is preferably not less than 0.7 and more preferably not less than 0.8, while proportion of d=1 is the best.

The hard coating of category (III) of the present invention preferably has substantially rock salt type crystal structure, in order to ensure high strength.

The hard coating of category (III) may be a stack of a plurality of layers of the same composition that satisfies the requirements described above, or a stack of a plurality of layers of different compositions that satisfy the requirements described above. Depending on the application, the hard coating of category (III) may have, either on one side or both sides thereof, coating film made of metal nitride, metal carbide or metal carbonitride that has rock salt structure of a composition different from that of the present invention, such as TiN, TiAlN, TiCrAlN, TiCN, TiAlCN, TiCrAlCN or TiC to such an extent as the wear resistance and oxidation resistance of the hard coating of the present invention are not compromised.

The hard coating of category (III) has total thickness preferably in a range from 0.5 µm to 20 µm. When the total thickness is less than 0.5 µm, the thin coating film cannot put the excellent wear resistance into full play. When the total thickness is more than 20 µm, on the other hand, the coating film may be chipped or come off during cutting operation. The film thickness is more preferably in a range from 1 µm to 15 µm.

While the present invention is not intended to define the method for manufacturing the hard coating of category (III), since the coating of the present invention may include elements that have widely different melting temperatures such as W and Al, it is difficult to control the composition by the electron beam vapor deposition or hollow cathode method, and accordingly it is recommended to form the film by sputtering method that utilizes a solid vaporization source or by arc ion plating (AIP) method.

When forming a film that includes elements that are widely different not only in the melting temperature but also in atomic weight such as Si, B and W, composition of the coating may become different from that of the target if the pressure is high during formation of the film. A cause of this trouble may be the scatter of the evaporated atoms and the assisting gas (Ar or $N_2$). To avoid such scattering, it is preferable to control the total pressure to not higher than 3 Pa in the case of AIP method, or not higher than 1 Pa in the case of sputtering method. However, since it becomes difficult to introduce nitrogen into the film when the pressure is too low, partial pressure of the reaction gas is preferably 0.5 Pa or higher in the case of AIP method, or 0.05 Pa or higher in the case of sputtering method.

Bias voltage applied to the base material (workpiece) when forming the film is preferably in a range from 30 to 200 V when forming the film using an AIP apparatus. Applying the bias voltage to the base material allows effective ion bombardment onto the base material (workpiece), thus accelerating the formation of AlN film having rock salt structure. To achieve this effect, it is preferable to apply the bias voltage of 30 V or higher. When the bias voltage is too high, however, the film being formed is etched by the ionized gas resulting in very low film forming rate. Therefore, the bias voltage is preferably not higher than 200 V.

Temperature of the base material (workpiece) when forming the film is preferably in a range from 300 to 800° C. when forming the film using an AIP apparatus. When the hard coating that has been formed has a large residual stress, the film cannot hold firmly onto the base metal and is likely to come off. Since the residual stress in the coating can be reduced by setting the temperature of the base material (workpiece) higher, it is preferable to set the temperature of the base material (workpiece) to 300° C. higher. When temperature of the base material (workpiece) is higher, the residual stress decreases but too low a residual stress leads to lower compressive strength, which compromises the function of the base material to resist breakage and, at the same time, the base material may experience thermal denaturing due to high temperature. Therefore, it is preferable to set the upper limit of temperature of the base material (workpiece) to 800° C.

An effective method of manufacturing the hard coating of category (III) is vapor phase coating such as ion plating or sputtering, wherein a target used as a solid evaporation source is evaporated or ionized and deposited on the workpiece. When the target has unfavorable property, however, stable electric discharge cannot be maintained when forming the coating film, resulting in such problems as non-uniform composition of the coating film that is formed. Thus the property of the target used in forming the hard coating of the present invention that has excellent wear resistance was studied, and the following findings were obtained.

Electric discharge was stabilized when forming the coating film, and the hard coating of the present invention could be formed efficiently, when a target having relative density of 92% or higher was used. When the target has a relative density lower than 92%, such a trouble may occur that satisfactory coating film cannot be formed due to scatter of the target material. This tendency is conspicuous in the case of AIP method that uses input power of a high energy density. Therefore, when the AIP method is used, relative density of the target is preferably 95% or higher, and more preferably 98% or higher.

In the vapor phase coating method such as AIP, composition of the target that is used determines the composition of the coating that is formed. Therefore, composition of the target is preferably the same as the composition of the coating film to be formed.

Thus the target used in forming the layer A is preferably one that has the same composition as that of the layer A and is selected from a group consisting of the following, where w, y and z that represent atomic ratios of Al, Si and B, respectively, $(Al_w, Cr_{1-w})$ satisfying the relation:

$$0.25 \leq w \leq 0.7;$$

$(Al_w, Si_y, B_z, Cr_{1-w-y-z})$ satisfying the relations:

$$0.25 \leq w \leq 0.7, \text{ and}$$

$$0 < y+z \leq 0.2; \text{ and}$$

$(Al_w, Si_y, B_z, Ti_{1-w-y-z})$ satisfying the relations:

$$0.25 \leq w \leq 0.7, \text{ and}$$

$$0 < y+z \leq 0.15.$$

The target used in forming the layer B is preferably one that has the same composition as that of the layer B, and is constituted from $(M_x, Si_y, B_z)$ (M represents W and/or Mo), where x, y and z that represent atomic ratios of M, Si and B, respectively, satisfy the following relations:

$$0.8 \leq x \leq 1,$$

$$0 \leq x+y \leq 0.2;$$

When deviation of the composition distribution of the target is within 0.5% by the number of atoms, composition distribution of the hard coating that is formed can also be made uniform, making it possible to form the film stably.

When the target includes much impurities (oxygen, hydrogen, chlorine, copper and magnesium) that inevitably mix in, such impurities are released from the target sporadically in the form of gas when forming the film, thus making it impossible to form the film satisfactorily due to unstable electrical discharge or, in the worst case, breakage of the target. Therefore, it is preferable to control the impurities in the target to 0.3% by weight or less for oxygen, 0.05% by weight or less for hydrogen, 0.2% by weight or less for chlorine, 0.05% by weight or less for copper and 0.03% by weight or less for magnesium.

While the present invention is not intended to specify the method of manufacturing the target, an effective method of making the target of the present invention is to apply cold isostatic pressing (CIP) or hot isostatic pressing (HIP) to a mixture of Al powder, Cr powder, Ti powder, Si powder, B powder, powder of element M and the like that have been prepared with proper weight proportions and particle size and uniformly mixed in a type V mixer or the like. Besides the methods described above, the target of the present invention may also be manufactured by hot extrusion method, ultra-high pressure hot press method or the like.

The present invention is further illustrated by the following examples. It is to be understood that the present invention is not limited to the examples, and various design variations made in accordance with the purports described hereinbefore and hereinafter are also included in the technical scope of the present invention.

EXAMPLE 1

Figure 3:
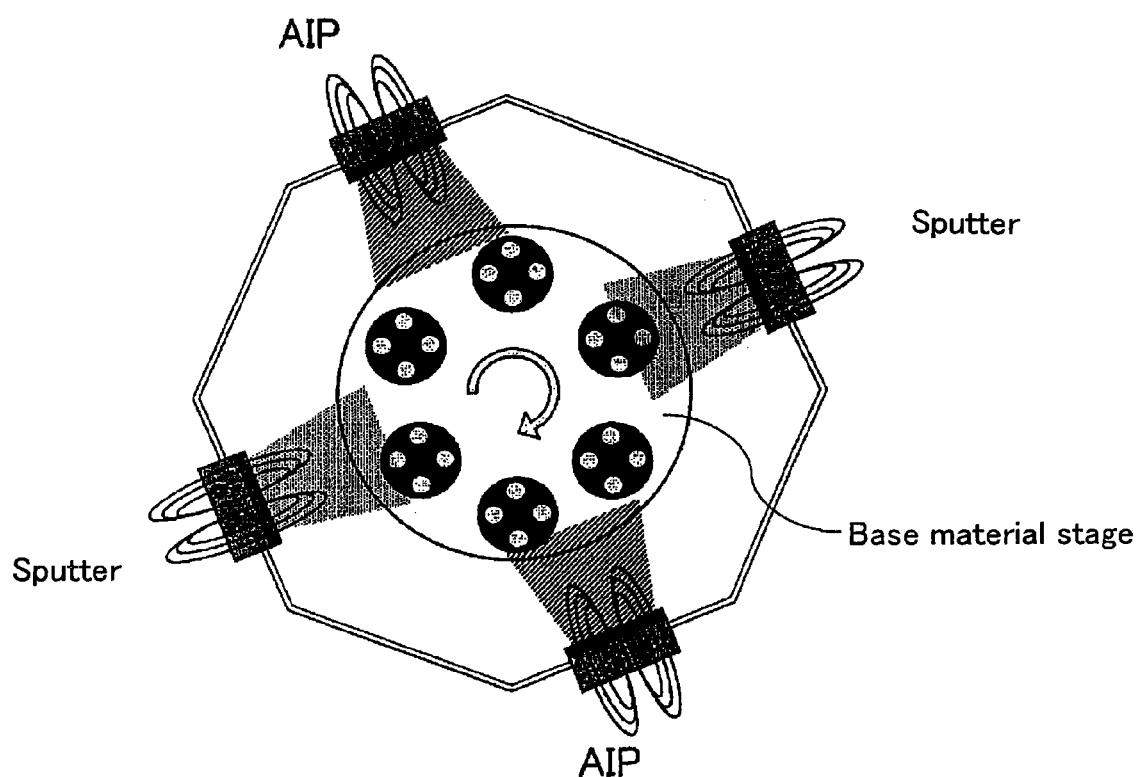
FIG. 3 is a schematic top view of the film forming apparatus used in Examples 1 through 3.

A coating film was formed by setting a Cr—Al alloy target, a Cr—Al—W alloy target or a Cr—Al—Mo alloy target in a film forming apparatus shown in FIG. 3.

A cemented carbide subjected to mirror quality polishing was used as the base material for the measurements of the composition, crystal structure and hardness of the coating film and thickness of oxide film after oxidation treatment (oxidation resistance), and ball end mill made of cemented carbide of 5R was used for the evaluation of cutting performance.

With the base material mounted as the workpiece on a stage of one of the film forming apparatuses and the chamber evacuated to a pressure not higher than $1 \times 10^{-3}$ Pa, the coating was formed by heating the base material (workpiece) to a temperature of about 500° C. with a heater installed in the chamber, and carrying out sputter cleaning with Ar ions.

When the coating was formed by using the sputtering apparatus shown in FIG. 3, a target 6 inches in diameter was used and the input power was set to 2 kW. To form a coating made of nitride, a gas mixture of $Ar:N_2=65:35$ was introduced. To form a coating made of carbonitride, a gas mixture of $Ar:(N_2+CH_4)=65:35$ was introduced with the total pressure being set to 0.5 Pa.

When the coating was formed by using the AIP apparatus shown in FIG. 3, a target 100 mm in diameter was used and arc current of 150 A was supplied. To form a coating made of nitride, $N_2$ atmosphere with total pressure of 2.7 Pa was used. To form a coating made of carbonitride, a gas mixture of $N_2$ and $CH_4$ (C content was controlled by changing the quantity of $CH_4$) was introduced.

Whichever the method was employed, a coating of 3 to 4 μm in thickness was formed on the surface of the base material (workpiece). A bias voltage of 30 to 50 V was applied to the base material in either of both methods, so that potential of the base material (workpiece) becomes negative relative to the ground.

Composition, crystal structure and hardness of the coating film and thickness of oxide film after oxidation treatment (oxidation resistance) of the coating film that has been formed on the cemented carbide subjected to mirror quality polishing as described above were measured as follows.

(a) Composition

Composition of the coating was measured by EPMA.

(b) Crystal Structure

Crystal structure was identified by X-ray diffraction analysis. In Table 1, C indicates cubic crystal and H indicates hexagonal crystal.

(c) Hardness

Hardness was measured with Micro-Vickers hardness meter by applying a load of 0.245 N.

(d) Oxidation Resistance

After applying oxidation treatment to the sample in air atmosphere at 900° C. for one hour, the thickness of the oxide film formed on the surface was measured at three points, with the measured values averaged to evaluate the oxidation resistance.

A ball end mill made of cemented carbide coated with a film as described above was used in a cutting test under the following conditions, and wear resistance of the coating film was evaluated by means of the amount of wear of the flank measured on the periphery.

<Cutting Conditions>
Workpiece: JIS SKD61 (HRC50 hardness)
Cutting speed: 220 m/min.
Feed rate: 0.06 mm/flute Depth of infeed: 4.5 mm
Axial infeed: 0.5 mm
Total length of cutting: 100 m Values of composition, crystal structure and hardness of the coating film, thickness of oxide film and the amount of wear of the flank measured as described above are shown in Table 1.

Cr—Al alloy, Cr—Al—W alloy, Cr—Al—W—Si alloy, Cr—Al—W—B alloy or Cr—Al—W—B—Si alloy.

A cemented carbide subjected to mirror quality polishing was used as the base material for the measurement of composition, crystal structure and hardness of the coating film and thickness of oxide film after oxidation treatment (oxidation

TABLE 1

| No. | Film forming method | Composition of film (Atomic ratio) | | | | | | Crystal structure | Hardness HV | Thickness of oxide film μm | Amount of wear μm |
|---|---|---|---|---|---|---|---|---|---|---|---|
| | | Cr | Al | W | Mo | C | N | | | | |
| 1 | AIP | 0.5 | 0.5 | 0 | 0 | 0 | 1 | C | 2500 | 1.70 | 250.0 |
| 2 | AIP | 0.5 | 0.48 | 0.02 | 0 | 0 | 1 | C | 2397 | 1.39 | 226.0 |
| 2' | AIP | 0.48 | 0.48 | 0.06 | 0 | 0 | 1 | C | 2500 | 0.89 | 120.0 |
| 3 | AIP | 0.46 | 0.46 | 0.08 | 0 | 0 | 1 | C | 2538 | 0.87 | 113.0 |
| 4 | AIP | 0.44 | 0.43 | 0.13 | 0 | 0 | 1 | C | 2632 | 0.61 | 73.5 |
| 5 | AIP | 0.38 | 0.4 | 0.22 | 0 | 0 | 1 | C | 2773 | 0.44 | 56.5 |
| 6 | AIP | 0.22 | 0.45 | 0.33 | 0 | 0 | 1 | C | 2820 | 0.44 | 62.2 |
| 7 | AIP | 0.26 | 0.35 | 0.39 | 0 | 0 | 1 | C | 2444 | 1.13 | 169.5 |
| 8 | Sputter | 0.52 | 0.45 | 0 | 0.03 | 0 | 1 | C | 2397 | 1.48 | 237.3 |
| 8' | Sputter | 0.46 | 0.47 | 0 | 0.07 | 0 | 1 | C | 2543 | 0.91 | 124.0 |
| 9 | Sputter | 0.43 | 0.42 | 0 | 0.15 | 0 | 1 | C | 2632 | 0.87 | 82.5 |
| 10 | Sputter | 0.43 | 0.38 | 0 | 0.19 | 0 | 1 | C | 2679 | 0.57 | 56.5 |
| 11 | Sputter | 0.37 | 0.38 | 0 | 0.25 | 0 | 1 | C | 2726 | 0.52 | 64.4 |
| 12 | Sputter | 0.3 | 0.32 | 0 | 0.38 | 0 | 1 | C | 2444 | 1.13 | 146.9 |
| 13 | AIP | 0.4 | 0.4 | 0.12 | 0.08 | 0 | 1 | C | 2773 | 0.45 | 73.5 |
| 14 | AIP | 0.44 | 0.35 | 0.06 | 0.15 | 0 | 1 | C | 2726 | 0.48 | 67.8 |
| 14' | AIP | 0.44 | 0.5 | 0.04 | 0.02 | 0 | 1 | C | 2580 | 0.88 | 110.0 |
| 15 | AIP | 0.65 | 0.15 | 0.2 | 0 | 0 | 1 | C | 2444 | 1.65 | 276.9 |
| 16 | AIP | 0.5 | 0.28 | 0.22 | 0 | 0 | 1 | C | 2632 | 0.77 | 98.3 |
| 17 | AIP | 0.26 | 0.5 | 0.24 | 0 | 0 | 1 | C | 2679 | 0.44 | 56.5 |
| 18 | AIP | 0.19 | 0.6 | 0.21 | 0 | 0 | 1 | C | 2867 | 0.39 | 50.9 |
| 19 | AIP | 0.11 | 0.67 | 0.22 | 0 | 0 | 1 | C + H | 2491 | 0.30 | 169.5 |
| 20 | AIP | 0.09 | 0.72 | 0.19 | 0 | 0 | 1 | H | 2256 | 0.30 | 201.1 |
| 21 | AIP | 0.31 | 0.51 | 0 | 0.18 | 0.1 | 0.9 | C | 2773 | 0.50 | 62.2 |
| 22 | AIP | 0.31 | 0.51 | 0 | 0.18 | 0.25 | 0.75 | C | 2820 | 0.59 | 58.8 |
| 23 | AIP | 0.31 | 0.51 | 0 | 0.18 | 0.3 | 0.7 | C | 2726 | 0.77 | 61.0 |
| 24 | AIP | 0.31 | 0.51 | 0 | 0.18 | 0.45 | 0.55 | C | 2679 | 0.96 | 67.8 |
| 25 | AIP | 0.31 | 0.51 | 0 | 0.18 | 0.6 | 0.4 | C | 2491 | 1.63 | 140.1 |
| 26 | AIP | 0.12 | 0.6 | 0 | 0.28 | 0 | 1 | C | 2717 | 0.58 | 76.8 |

From Table 1, it can be seen that the coating film that satisfies the requirements of the present invention shows high Vickers hardness, and thickness of oxide film formed by oxidation treatment is small with the amount of wear during cutting test kept at a low level. In contrast, the coating film that does not satisfy the requirements of the present invention shows low hardness, poor oxidation resistance with thick oxide film or a significant amount of wear during cutting test. Specifically, samples Nos. 1, 2', 8' and 14' that do not include element M or include less than the specified amount of element M, show low hardness, poor oxidation resistance and significant amount of wear during cutting test. Samples Nos. 7 and 12 that include excessive amount of element M also show low hardness, poor oxidation resistance and a significant amount of wear during cutting test.

Sample No. 15 that includes low content of Al shows low hardness, poor oxidation resistance and significant amount of wear during cutting test. Samples Nos. 19 and 20 that include excessive amount of Al show low hardness and poor wear resistance. Sample No. 25 that has high proportion of N atoms shows low hardness, low oxidation resistance and low wear resistance.

EXAMPLE 2

A coating film was formed by setting the target in a film forming apparatus shown in FIG. 3. The target was made of resistance), and a ball end mill made of cemented carbide of 5R was used for the evaluation of cutting performance.

With the base material mounted as the workpiece on a stage of one of the film forming apparatuses and the chamber evacuated to a pressure not higher than $1 \times 10^{-3}$ Pa, the coating film was formed by heating the base material (workpiece) to a temperature of about 500° C. with a heater installed in the chamber, and carrying out sputter cleaning with Ar ions.

When the coating was formed by using the sputtering apparatus shown in FIG. 3, a target 6 inches in diameter was used and the input power was set to 2 kW. To form a coating film made of nitride, a gas mixture of $Ar:N_2=65:35$ was introduced. To form a coating film made of carbonitride, a gas mixture of $Ar:(N_2+CH_4)=65:35$ was introduced with the total pressure being set to 0.5 Pa.

When the coating film was formed by using the AIP apparatus shown in FIG. 3, a target 100 mm in diameter was used and arc current of 150 A was supplied. To form a coating made of nitride, $N_2$ atmosphere with total pressure of 2.7 Pa was used. To form a coating made of carbonitride, a gas mixture of $N_2$ and $CH_4$ (C content was controlled by changing the quantity of $CH_4$) was introduced.

Whichever the method was employed, a coating of 3 to 4 μm in thickness was formed on the surface of the base material (workpiece). A bias voltage of 30 to 50 V was applied to the base material in either of both methods, so that potential of the base material (workpiece) becomes negative relative to the ground.

Composition, crystal structure and hardness of the coating film and thickness of oxide film after oxidation treatment (oxidation resistance) of the coating film that has been formed as described above, and the amount of wear of the flank of the cutting tool (wear resistance) during the cutting test were measured similarly to Example 1. The results are shown in Table 2 and Table 3.

Sample No. 25 that has high proportion of N atoms shows low hardness, poor wear resistance and low oxidation resistance.

EXAMPLE 3

Influence of relative density of the target on surface roughness and hardness of the coating film to be formed was studied.

TABLE 2

| No. | Film forming method | Composition of film (Atomic ratio) | | | | | | | | Crystal structure | Hardness HV | Thickness of oxide film μm | Amount of wear μm |
|---|---|---|---|---|---|---|---|---|---|---|---|---|---|
| | | Cr | Al | W | Mo | B | Si | C | N | | | | |
| 1 | AIP | 0.5 | 0.5 | 0 | 0 | 0 | 0 | 0 | 1 | C | 2375 | 1.7 | 250 |
| 2 | AIP | 0.31 | 0.51 | 0.18 | 0 | 0 | 0 | 0 | 1 | C | 2820 | 0.44 | 56.5 |
| 3 | AIP | 0.28 | 0.51 | 0.18 | 0 | 0 | 0.03 | 0 | 1 | C | 2867 | 0.39 | 50.9 |
| 4 | AIP | 0.24 | 0.51 | 0.18 | 0 | 0 | 0.07 | 0 | 1 | C | 2820 | 0.32 | 45.2 |
| 5 | AIP | 0.16 | 0.51 | 0.18 | 0 | 0 | 0.15 | 0 | 1 | C + H | 2773 | 0.26 | 84.8 |
| 6 | AIP | 0.08 | 0.51 | 0.18 | 0 | 0 | 0.23 | 0 | 1 | H | 2444 | 0.22 | 135.6 |
| 7 | AIP | 0.27 | 0.51 | 0.18 | 0 | 0.04 | 0 | 0 | 1 | C | 2820 | 0.42 | 54.2 |
| 8 | AIP | 0.22 | 0.51 | 0.18 | 0 | 0.09 | 0 | 0 | 1 | C | 2867 | 0.38 | 50.9 |
| 9 | AIP | 0.06 | 0.51 | 0.18 | 0 | 0.17 | 0.08 | 0 | 1 | C + H | 2632 | 0.35 | 146.9 |
| 10 | AIP | 0.24 | 0.51 | 0.18 | 0 | 0.04 | 0.03 | 0 | 1 | C | 2820 | 0.30 | 52.0 |

TABLE 3

| No. | Film forming method | Composition of film (Atomic ratio) | | | | | | | | Crystal structure | Hardness HV | Thickness of oxide film μm | Amount of wear μm |
|---|---|---|---|---|---|---|---|---|---|---|---|---|---|
| | | Ti | Al | W | Mo | B | Si | C | N | | | | |
| 11 | AIP | 0.5 | 0.5 | 0 | 0 | 0 | 0 | 0 | 1 | C | 2500 | 1.7 | 250 |
| 12 | AIP | 0.31 | 0.51 | 0.18 | 0 | 0 | 0 | 0 | 1 | C | 3000 | 0.5 | 50 |
| 13 | AIP | 0.28 | 0.51 | 0.18 | 0 | 0 | 0.03 | 0 | 1 | C | 3050 | 0.45 | 45 |
| 14 | AIP | 0.24 | 0.51 | 0.18 | 0 | 0 | 0.07 | 0 | 1 | C | 3000 | 0.37 | 40 |
| 15 | AIP | 0.19 | 0.51 | 0.18 | 0 | 0 | 0.12 | 0 | 1 | C + H | 2950 | 0.3 | 75 |
| 16 | AIP | 0.12 | 0.51 | 0.18 | 0 | 0 | 0.19 | 0 | 1 | H | 2600 | 0.25 | 120 |
| 17 | AIP | 0.27 | 0.51 | 0.18 | 0 | 0.04 | 0 | 0 | 1 | C | 3000 | 0.48 | 48 |
| 18 | AIP | 0.22 | 0.51 | 0.18 | 0 | 0.09 | 0 | 0 | 1 | C | 3050 | 0.44 | 45 |
| 19 | AIP | 0.14 | 0.51 | 0.18 | 0 | 0.17 | 0 | 0 | 1 | C + H | 2800 | 0.4 | 130 |
| 20 | AIP | 0.24 | 0.51 | 0.18 | 0 | 0.04 | 0.03 | 0 | 1 | C | 3000 | 0.35 | 46 |
| 21 | AIP | 0.28 | 0.51 | 0.18 | 0 | 0 | 0.03 | 0.1 | 0.9 | C | 3150 | 0.5 | 48 |
| 22 | AIP | 0.28 | 0.51 | 0.18 | 0 | 0 | 0.03 | 0.25 | 0.75 | C | 3100 | 0.53 | 52 |
| 23 | AIP | 0.28 | 0.51 | 0.18 | 0 | 0 | 0.03 | 0.3 | 0.7 | C | 3100 | 0.55 | 51 |
| 24 | AIP | 0.28 | 0.51 | 0.18 | 0 | 0 | 0.03 | 0.45 | 0.55 | C | 3050 | 0.61 | 53 |
| 25 | AIP | 0.28 | 0.51 | 0.18 | 0 | 0 | 0.03 | 0.6 | 0.4 | C | 2800 | 0.87 | 87 |

From Tables 2 and 3, it can be seen that the coating film that satisfies the requirements of the present invention shows high Vickers hardness, and thickness of oxide film formed by oxidation treatment is small with the amount of wear during cutting test kept at a low level. In contrast, the coating film that does not satisfy the requirements of the present invention shows low hardness, poor oxidation resistance with thick oxide film or significant amount of wear during the cutting test. Specifically, samples Nos. 1 and 11, that do not include element M show low hardness, poor oxidation resistance with thick oxide film and a significant amount of wear during cutting test. Samples Nos. 6 and 16 that include a high content of Si show low hardness and a significant amount of wear during cutting test because the crystal structure was turned to hexagonal system.

Samples Nos. 9 and 19 that have high proportion of (Si+B) atoms show significant amounts of wear during cutting test because hexagonal crystal was generated.

Predetermined quantities of Al powder, Ti powder, Cr powder, W powder, Mo powder, Si powder and B powder that passed 100 mesh sieve were mixed. The mixture was used to make targets of various compositions shown in Table 4 or Table 5 by HIP process at a temperature of 500° C. under pressure of 100 MPa, hot forging at a temperature of 400° C. or hot press process (sintering temperature 550° C.). Composition of the target was measured by X-ray fluorescence analysis.

With the target being set in the film forming apparatus shown in FIG. 3, coating film was formed by electrical discharge. Surface roughness and hardness of the coating film thus formed were measured. Measurement of hardness was carried out similarly to Example 1. Results of the measurements are shown in Table 4 and Table 5.

TABLE 4

| Target No. | manufacturing method | Composition of target (Atomic ratio) | | | | | | Density % | Film forming method | Surface roughness μm | Hardness HV |
|---|---|---|---|---|---|---|---|---|---|---|---|
| | | Cr | Al | W | Mo | B | Si | | | | |
| 1 | HIP | 0.24 | 0.51 | 0.18 | 0 | 0 | 0.07 | 95 | AIP | 0.1955 | 2760 |
| 2 | HIP | 0.24 | 0.51 | 0.18 | 0 | 0 | 0.07 | 100 | AIP | 0.0575 | 2806 |
| 3 | Hot forging | 0.24 | 0.51 | 0.18 | 0 | 0 | 0.07 | 85 | AIP | 0.4025 | 2576 |
| 4 | Hot forging | 0.24 | 0.51 | 0.18 | 0 | 0 | 0.07 | 91 | AIP | 0.345 | 2622 |
| 5 | Hot forging | 0.24 | 0.51 | 0.18 | 0 | 0 | 0.07 | 95 | AIP | 0.1955 | 2714 |
| 6 | Hot forging | 0.24 | 0.51 | 0.18 | 0 | 0 | 0.07 | 100 | AIP | 0.0575 | 2806 |
| 7 | Hot press | 0.24 | 0.51 | 0.18 | 0 | 0 | 0.07 | 87 | AIP | 0.345 | 2622 |
| 8 | Hot press | 0.24 | 0.51 | 0.18 | 0 | 0 | 0.07 | 90 | AIP | 0.115 | 2576 |
| 9 | HIP | 0.21 | 0.51 | 0 | 0.18 | 0.1 | 0 | 95 | Sputter | 0.0345 | 2760 |
| 10 | HIP | 0.21 | 0.51 | 0 | 0.18 | 0.1 | 0 | 100 | Sputter | 0.00575 | 2806 |
| 11 | Hot forging | 0.21 | 0.51 | 0 | 0.18 | 0.1 | 0 | 85 | Sputter | 0.0115 | 2576 |
| 12 | Hot forging | 0.21 | 0.51 | 0 | 0.18 | 0.1 | 0 | 91 | Sputter | 0.1725 | 2622 |
| 13 | Hot forging | 0.21 | 0.51 | 0 | 0.18 | 0.1 | 0 | 95 | Sputter | 0.023 | 2714 |
| 14 | Hot forging | 0.21 | 0.51 | 0 | 0.18 | 0.1 | 0 | 100 | Sputter | 0.0115 | 2806 |
| 15 | Hot press | 0.21 | 0.51 | 0 | 0.18 | 0.1 | 0 | 87 | Sputter | 0.1725 | 2622 |
| 16 | Hot press | 0.21 | 0.51 | 0 | 0.18 | 0.1 | 0 | 90 | Sputter | 0.115 | 2576 |

TABLE 5

| Target No. | manufacturing method | Composition of target (Atomic ratio) | | | | | | Density % | Film forming method | Surface roughness μm | Hardness HV |
|---|---|---|---|---|---|---|---|---|---|---|---|
| | | Ti | Al | W | Mo | B | Si | | | | |
| 21 | HIP | 0.24 | 0.51 | 0.18 | 0 | 0 | 0.07 | 95 | AIP | 0.17 | 3000 |
| 22 | HIP | 0.24 | 0.51 | 0.18 | 0 | 0 | 0.07 | 100 | AIP | 0.05 | 3050 |
| 23 | Hot forging | 0.24 | 0.51 | 0.18 | 0 | 0 | 0.07 | 85 | AIP | 0.35 | 2800 |
| 24 | Hot forging | 0.24 | 0.51 | 0.18 | 0 | 0 | 0.07 | 91 | AIP | 0.3 | 2850 |
| 25 | Hot forging | 0.24 | 0.51 | 0.18 | 0 | 0 | 0.07 | 95 | AIP | 0.17 | 2950 |
| 26 | Hot forging | 0.24 | 0.51 | 0.18 | 0 | 0 | 0.07 | 100 | AIP | 0.05 | 3050 |
| 27 | Hot press | 0.24 | 0.51 | 0.18 | 0 | 0 | 0.07 | 87 | AIP | 0.3 | 2850 |
| 28 | Hot press | 0.24 | 0.51 | 0.18 | 0 | 0 | 0.07 | 90 | AIP | 0.1 | 2800 |
| 29 | HIP | 0.21 | 0.51 | 0 | 0.18 | 0.1 | 0 | 95 | Sputter | 0.03 | 3000 |
| 30 | HIP | 0.21 | 0.51 | 0 | 0.18 | 0.1 | 0 | 100 | Sputter | 0.005 | 3050 |
| 31 | Hot forging | 0.21 | 0.51 | 0 | 0.18 | 0.1 | 0 | 85 | Sputter | 0.01 | 2800 |
| 32 | Hot forging | 0.21 | 0.51 | 0 | 0.18 | 0.1 | 0 | 91 | Sputter | 0.15 | 2850 |
| 33 | Hot forging | 0.21 | 0.51 | 0 | 0.18 | 0.1 | 0 | 95 | Sputter | 0.02 | 2950 |
| 34 | Hot forging | 0.21 | 0.51 | 0 | 0.18 | 0.1 | 0 | 100 | Sputter | 0.01 | 3050 |
| 35 | Hot press | 0.21 | 0.51 | 0 | 0.18 | 0.1 | 0 | 87 | Sputter | 0.15 | 2850 |
| 36 | Hot press | 0.21 | 0.51 | 0 | 0.18 | 0.1 | 0 | 90 | Sputter | 0.1 | 2800 |

From Table 4 and Table 5, it can be seen that the coating films formed by using targets that have the relative density specified by the present invention have small surface roughness and high hardness. The coating films formed by using targets that do not have the relative density specified by the present invention, in contrast, have such problems as large surface roughness (which results in a significant amount of wear due to high frictional resistance during cutting operation) and insufficient hardness.

EXAMPLE 4

Figure 4:
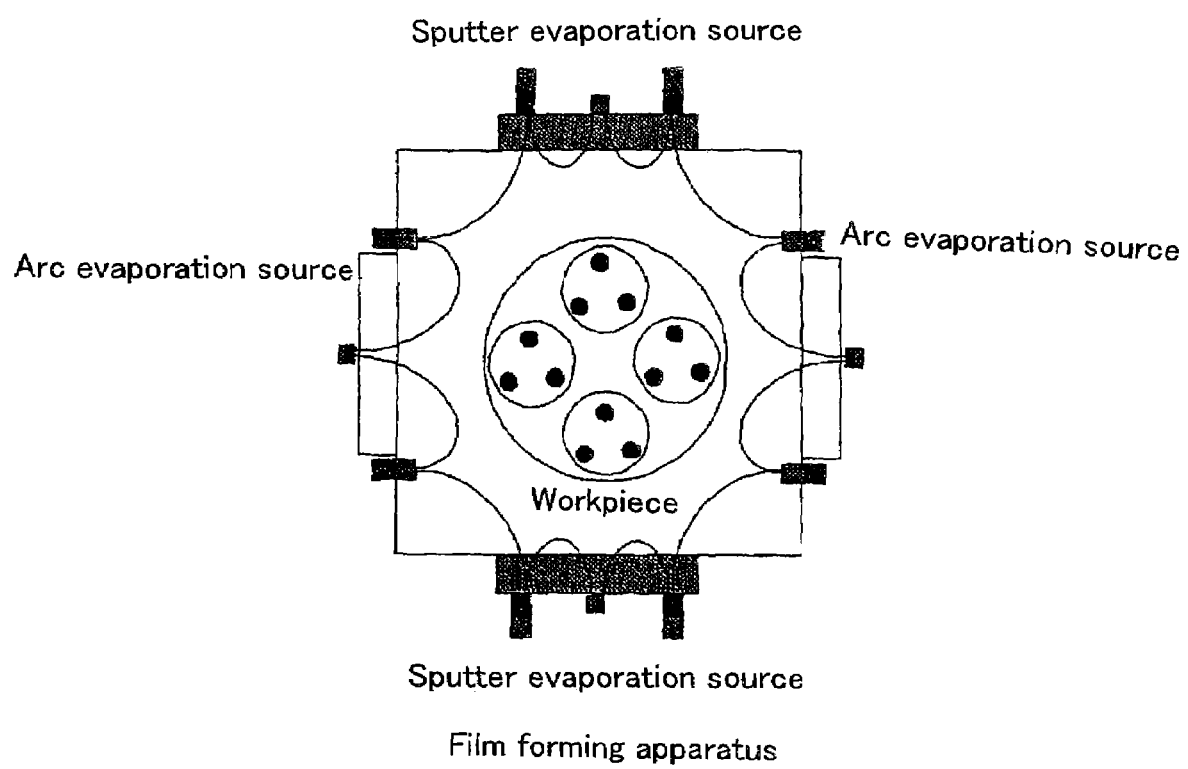
FIG. 4 is a schematic top view of the film forming apparatus used in Examples 4 through 8.

A coating film having the composition shown in Table 6 was formed by setting a target that contained Ti, Cr, Al, W and Mo in a film forming apparatus having an UBMS and an AIP evaporation source shown in FIG. 4, and using the UBMS or the AIP evaporation source. A cemented carbide base material was used in the measurements of structure and composition of the coating, and friction coefficient at high temperature, and a square end mill made of cemented carbide (six-blade) was used in the cutting test.

Whichever the UBMS method or the AIP method was employed, the base material was placed in the chamber that was evacuated to create vacuum. The coating was formed by heating the base material (workpiece) to a temperature of about 500° C. while carrying out sputter cleaning with Ar ions with Ar pressure of 0.6 Pa and bias voltage of −500 V applied to the base material for three minutes.

When the coating was formed by the UBMS method, a bias voltage of 70 V was applied to the base material in an atmosphere of Ar-nitrogen gas mixture or Ar-nitrogen-methane gas mixture (total pressure 0.6 Pa). When the AIP method was used, a bias voltage of 70 V was applied to the base material in an atmosphere of nitrogen gas or nitrogen-methane gas mixture (total pressure 4 Pa), while supplying arc current of 150 A. The coating was formed to thickness of about 3 μm in either case.

Composition, crystal structure and hardness of the coating film and friction coefficient at high temperature (high-temperature anti-friction property) of the coating film that has been formed as described above were measured as follows.

(a) Composition

Composition of the coating was measured by EPMA.

(b) Crystal Structure

Crystal structure was identified by X-ray diffraction analysis. In Table 6, B1 indicates cubic crystal and B4 indicates hexagonal crystal.

(c) Hardness

Hardness was measured with Micro-Vickers hardness meter by applying a load of 0.245 N for 15 seconds.

(d) High-Temperature Anti-Friction Performance

Friction coefficient of the coating film with an alloy tool steel for hot dies (SKD61, HRC50) at a high temperature was measured after both members had made relative movement of sliding over a distance of 1000 m at a speed of 0.3 m/s under a vertical load of 2 N at 800° C. in air atmosphere.

Cutting performance was evaluated by the wear of flank of the cutting tool, after cutting a workpiece made of SKD11 (HRC60) with the six-blade square end mill made of hard metal over a length of 50 m at a cutting speed of 150 m/min, feed rate of 0.05 mm/min., depth of infeed of 5 mm and axial infeed of 0.1 mm. The result of evaluation is shown in Table 6.

From Table 6, it can be seen that the coating film that satisfies the requirements of the present invention shows excellent high-temperature anti-friction performance and high hardness while keeping the amount of wear during cutting test at a low level. In contrast, the coating film that does not satisfy the requirements of the present invention shows poor high-temperature anti-friction performance, low hardness or significant amount of wear during cutting test. Specifically, samples Nos. 1 through 4, that do not include element M or include less than the specified amount of element M, show poor high-temperature anti-friction performance and significant amount of wear during cutting test. Sample No. 8 that includes excessive amount of element M shows a significant amount of wear during cutting test.

Sample No. 9 that includes a very low content of Al shows low hardness and a significant amount of wear during cutting test. Sample No. 12 that includes an excessive amount of Al shows significant softening of the coating and a large amount of wear during cutting test.

Sample No. 15 that includes an excessive amount of C shows lower hardness. Sample No. 16 that includes an excessive amount of Ti and accordingly a relatively low content of Al shows lower hardness and a large amount of wear during cutting test.

TABLE 6

| No. | Metallic element (Atomic ratio) | | | | | | Non-metallic element (Atomic ratio) | | Crystal structure | Friction coefficient | Hardness of coating GPa | Amount of wear μm |
| | Ti | Cr | Al | Mo | W | Si | B | C | N | | | | |
| --- | --- | --- | --- | --- | --- | --- | --- | --- | --- | --- | --- | --- | --- |
| 1 | 0.5 | 0 | 0.5 | 0 | 0 | 0 | 0 | 0 | 1 | B1 | 0.8 | 26 | 100 |
| 2 | 1 | 0 | 0 | 0 | 0 | 0 | 0 | 0 | 1 | B1 | 0.75 | 22 | 125 |
| 3 | 0.2 | 0.2 | 0.6 | 0 | 0 | 0 | 0 | 0 | 1 | B1 | 0.65 | 30 | 75 |
| 4 | 0.2 | 0.2 | 0.59 | 0 | 0.01 | 0 | 0 | 0 | 1 | B1 | 0.65 | 30 | 77 |
| 5 | 0.2 | 0.15 | 0.6 | 0 | 0.05 | 0 | 0 | 0 | 1 | B1 | 0.5 | 32 | 40 |
| 6 | 0.15 | 0.16 | 0.55 | 0 | 0.14 | 0 | 0 | 0 | 1 | B1 | 0.45 | 34 | 30 |
| 7 | 0.1 | 0.13 | 0.5 | 0 | 0.27 | 0 | 0 | 0 | 1 | B1 | 0.42 | 32 | 35 |
| 8 | 0.08 | 0.08 | 0.4 | 0 | 0.44 | 0 | 0 | 0 | 1 | B1 | 0.35 | 29 | 65 |
| 9 | 0.3 | 0.4 | 0.2 | 0.1 | 0 | 0 | 0 | 0 | 1 | B1 | 0.55 | 27 | 70 |
| 10 | 0.15 | 0.2 | 0.5 | 0.15 | 0 | 0 | 0 | 0 | 1 | B1 | 0.45 | 31 | 37 |
| 11 | 0.16 | 0.1 | 0.68 | 0 | 0.06 | 0 | 0 | 0 | 1 | B1 + B4 | 0.58 | 32 | 39 |
| 12 | 0.06 | 0.13 | 0.77 | 0.04 | 0 | 0 | 0 | 0 | 1 | B4 | 0.64 | 22 | 78 |
| 13 | 0.2 | 0.13 | 0.55 | 0 | 0.12 | 0 | 0 | 0.2 | 0.8 | B1 | 0.44 | 32 | 40 |
| 14 | 0.2 | 0.13 | 0.55 | 0 | 0.12 | 0 | 0 | 0.4 | 0.6 | B1 | 0.47 | 30 | 50 |
| 15 | 0.2 | 0.13 | 0.55 | 0 | 0.12 | 0 | 0 | 0.6 | 0.4 | B1 | 0.44 | 27 | 68 |
| 16 | 0.8 | 0.05 | 0.1 | 0.05 | 0 | 0 | 0 | 0 | 1 | B1 | 0.77 | 25 | 95 |
| 17 | 0.15 | 0.19 | 0.5 | 0.04 | 0.12 | 0 | 0 | 0 | 1 | B1 | 0.4 | 33 | 30 |

EXAMPLE 5

A coating film that further included Si and/or B was formed and characteristics thereof were studied. A target including Ti, Cr, Al, element M, Si and/or B was set in the film forming apparatus shown in FIG. 4 to form the coating film having the composition shown in Table 7, similarly to Example 4. Characteristics of the coating thus obtained were evaluated similarly to Example 4. The results are shown in Table 7.

TABLE 7

| No. | Metallic element (Atomic ratio) | | | | | | | Non-metallic element (Atomic ratio) | | Crystal structure | Friction coefficient | Hardness of coating GPa | Amount of wear μm |
| | Ti | Cr | Al | Mo | W | Si | B | C | N | | | | |
| --- | --- | --- | --- | --- | --- | --- | --- | --- | --- | --- | --- | --- | --- |
| 21 | 0.45 | 0 | 0.5 | 0 | 0 | 0.05 | 0 | 0 | 1 | B1 | 0.8 | 27 | 78 |
| 22 | 0.9 | 0 | 0 | 0 | 0 | 0 | 0.1 | 0 | 1 | B1 | 0.7 | 22 | 110 |
| 23 | 0.2 | 0.2 | 0.6 | 0 | 0 | 0 | 0 | 0 | 1 | B1 | 0.65 | 30 | 75 |
| 24 | 0.15 | 0.16 | 0.55 | 0 | 0.14 | 0 | 0 | 0 | 1 | B1 | 0.45 | 34 | 30 |
| 25 | 0.15 | 0.15 | 0.55 | 0 | 0.14 | 0.01 | 0 | 0 | 1 | B1 | 0.45 | 32 | 30 |
| 26 | 0.15 | 0.15 | 0.55 | 0 | 0.11 | 0.04 | 0 | 0 | 1 | B1 | 0.45 | 34 | 20 |
| 27 | 0.15 | 0.09 | 0.5 | 0 | 0.16 | 0.1 | 0 | 0 | 1 | B1 | 0.4 | 33 | 22 |
| 28 | 0.11 | 0.13 | 0.45 | 0 | 0.13 | 0.18 | 0 | 0 | 1 | B4 | 0.5 | 31 | 45 |
| 29 | 0.16 | 0.12 | 0.45 | 0.17 | 0.04 | 0 | 0.06 | 0 | 1 | B1 | 0.4 | 31 | 35 |

TABLE 7-continued

| | Metallic element (Atomic ratio) | | | | | | Non-metallic element (Atomic ratio) | | Crystal | Friction | Hardness of coating | Amount of wear |
|---|---|---|---|---|---|---|---|---|---|---|---|---|
| No. | Ti | Cr | Al | Mo | W | Si | B | C | N | structure | coefficient | GPa | μm |
| 30 | 0.08 | 0.09 | 0.5 | 0.21 | 0 | 0 | 0.12 | 0 | 1 | B1 | 0.35 | 32 | 37 |
| 31 | 0.1 | 0.05 | 0.47 | 0.18 | 0 | 0 | 0.2 | 0 | 1 | B1 | 0.33 | 29 | 47 |
| 32 | 0.1 | 0.08 | 0.55 | 0 | 0.15 | 0.05 | 0.07 | 0 | 1 | B1 | 0.3 | 35 | 19 |

From Table 7, it can be seen that the coating film that satisfies the requirements of the present invention shows excellent high-temperature anti-friction performance, high Vickers hardness and an amount of wear during cutting test kept at a low level. Particularly the hard coating that includes Si and/or B tends to have higher high-temperature anti-friction performance. In contrast, the coating film that does not satisfy the requirements of the present invention shows poor high-temperature anti-friction performance, low hardness or a significant amount of wear during cutting test. Specifically, comparing the theoretical density calculated from the composition and the actual density of the target determined by Archimedes method.

With the target being set in the film forming apparatus shown in FIG. 4, coating film was formed by electrical discharge under conditions similar to those of Example 4 by the UBMS method or the AIP method. Measurement of surface roughness and hardness of the coating thus formed and cutting test were conducted. Measurement of hardness and the cutting test were conducted similarly to Example 4. Results are shown in Table 8.

TABLE 8

| No. | Target manufacturing method | Relative density % | Condition of electrical discharge | Surface roughness (Ra) μm | Hardness of coating GPa | Wear μm |
|---|---|---|---|---|---|---|
| 41 | Sintering | 90 | Unable to form film due to concentrated discharge | 0.2 | — | 55 |
| 42 | Sintering | 93 | Good | 0.15 | 30 | 40 |
| 43 | Sintering | 95 | Good | 0.1 | 31 | 32 |
| 44 | HIP | 98 | Good | 0.07 | 33 | 29 |
| 45 | HIP | 99 | Good | 0.05 | 33 | 25 |
| 46 | HIP | 100 | Good | 0.05 | 33 | 25 |
| 47 | Hot forging | 99 | Good | 0.05 | 33 | 25 |
| 48 | Hot forging | 100 | Good | 0.05 | 33 | 25 | sample No. 21 that includes an excessive content of Ti shows a large amount of wear during cutting test. Sample No. 22 that includes an excessive content of Ti and accordingly a relatively low Al content shows low hardness and a large amount of wear during cutting test. Sample No. 23 that does not include element M shows poor high-temperature anti-friction performance and a significant amount of wear during cutting test.

EXAMPLE 6

Influence of relative density of the target on the electrical discharge, surface roughness and hardness of the coating was studied.

Target (constituted from Ti in proportion of 0.15 in terms of the number of atoms, Cr in proportion of 0.15, Al in proportion of 0.55, W in proportion of 0.11 and Si in proportion of 0.04) used for forming the coating film having composition No. 6 shown in Table 7 was made by HIP process, hot forging or sintering method shown in Table 8. The HIP process was carried out at a temperature from 450 to 500° C. under pressure of 1000 atm. The hot forging process was carried out at a temperature of 400° C. and the sintering method was carried out at a temperature of 800° C.

After identifying the composition of the target by X-ray diffraction, relative density of the target was estimated by From Table 8, it can be seen that the coating films formed by using a target that has the relative density specified by the present invention has small surface roughness and high hardness. The coating films formed by using targets that do not have the relative density specified by the present invention, in contrast, have such problems as large surface roughness (which results in a significant amount of wear due to high frictional resistance during cutting operation) and large amount of wear during cutting test.

EXAMPLE 7

Hard coating having the stacked structure of layer A and layer B as shown in Table 9 (number of stacked layers and thickness thereof) was formed by setting a target shown in Table 9 in the film forming apparatus having the UBMS and the AIP evaporation source shown in FIG. 4. A hard metal subjected to mirror quality polishing was used as the base material for the measurement of composition, crystal structure and hardness of the coating film and thickness of oxide film after oxidation treatment (oxidation resistance), and a ball end mill made of hard metal of 5R was used for the evaluation of cutting performance.

With the base material mounted as the workpiece on a stage of one of the film forming apparatuses described above and the chamber evacuated to a pressure not higher than $1 \times 10^{-3}$ Pa, the coating was formed by heating the base material (workpiece) to a temperature of about 500° C. with a heater installed in the chamber, and carrying out sputter cleaning with Ar ions.

When the coating was formed by using only the AIP method, a target 100 mm in diameter was used and arc current of 150 A was supplied. To form a coating made of nitride, $N_2$ atmosphere with total pressure of 2.7 Pa was used. To form a coating made of carbonitride, a gas mixture of $N_2$ and $CH_4$ (C content was controlled by changing the quantity of $CH_4$) was introduced.

When the coating was formed by using only the UBMS method, a bias voltage of 30 to 50 V was applied to the base material (workpiece), so that potential of the base material (workpiece) became negative relative to the ground. A target 6 inches in diameter was mounted in the sputtering apparatus and the input power was set to 2 kW. To form a coating made of nitride, a gas mixture of Ar:$N_2$=65:35 was introduced. To form a coating made of carbonitride, a gas mixture of Ar:($N_2$+$CH_4$) 65:35 was introduced with the total pressure being set to 0.5 Pa.

When the UBMS method and the AIP method were combined, the base material was etched with Ar ions and the UBMS and the AIP evaporation source were operated to make electrical discharge at the same time in an atmosphere of Ar and 50% $N_2$ gas under a pressure of 2.7 Pa. The workpiece was mounted on the base material holder that rotated at the center, so that the workpiece passed in front of the AIP and the sputtering evaporation source alternately.

Thicknesses of the layer A and the layer B of the stacked coating film were controlled by changing the evaporation rates of the evaporation sources and the rotating speed of the base material. The hard coating (multi-layer coating) having total thickness of 3 to 4 μm was formed on the surface of the base material (workpiece).

Composition, crystal structure and hardness of the coating film, thickness of oxide film and the amount of wear of the flank of the multi-layer coating described above were measured as follows.

(a) Composition
Composition of the coating was measured by EPMA.

(b) Crystal Structure
Crystal structure was identified by X-ray diffraction analysis. In Table 6, C indicates cubic crystal.

(c) Hardness
Hardness was measured with Micro-Vickers hardness meter by applying a load of 0.245 N for 15 seconds.

(d) Oxidation Resistance
After applying oxidation treatment to the sample in air atmosphere at 900° C. for one hour, thickness of the oxide film formed on the surface was measured at three points, with the measured values averaged to evaluate the oxidation resistance.

A ball end mill made of hard metal coated with a film as described above was used in cutting test under the following conditions, and wear resistance of the coating was evaluated by means of the amount of wear of the flank measured on the periphery.

<Cutting Conditions>
Workpiece: JIS SKD61 (HRC50 hardness)
Cutting speed: 220 m/min.
Feed rate: 0.06 mm/flute
Depth of infeed: 4.5 mm
Axial infeed: 0.5 mm
Total length of cutting: 100 m Composition, crystal structure and hardness of the coating film, thickness of oxide film and the amount of wear of the flank measured as described above are shown in Table 9.

TABLE 9

| No. | AIP Target | Layer A | Thickness nm | Sputtering Target | Layer B |
|---|---|---|---|---|---|
| 1 | Cr0.4Al0.6 | (Cr0.4Al0.6)N | 5 | W | WN |
| 2 | Cr0.4Al0.6 | (Cr0.4Al0.6)N | 8 | W | WN |
| 3 | Cr0.4Al0.6 | (Cr0.4Al0.6)N | 20 | W | WN |
| 4 | Cr0.4Al0.6 | (Cr0.4Al0.6)N | 15 | W | WN |
| 5 | Cr0.4Al0.6 | (Cr0.4Al0.6)N | 12 | W | WN |
| 6 | Cr0.4Al0.6 | (Cr0.4Al0.6)N | 5 | W | WN |
| 7 | Cr0.4Al0.6 | (Cr0.4Al0.6)N | 2 | W | WN |
| 8 | Cr0.4Al0.6 | (Cr0.4Al0.6)N | 0.2 | W | WN |
| 9 | Cr0.4Al0.6 | (Cr0.4Al0.6)(C0.2N0.8) | 15 | Mo | Mo(C0.2N0.8) |
| 10 | Cr0.4Al0.6 | (Cr0.4Al0.6)N | 15 | Mo0.9B0.1 | (Mo0.9B0.1)N |
| 11 | Cr0.35Al0.65 | (Cr0.35Al0.65)N | 15 | W0.8Si0.2 | (W0.8Si0.2)N |
| 12 | Cr0.5Al0.47Si0.03 | (Cr0.5Al0.47Si0.03)(C0.1N0.9) | 15 | W | W(C0.1N0.9) |
| 13 | Cr0.6Al0.35B0.05 | (Cr0.6Al0.35B0.05)N | 15 | W0.8Si0.2 | (W0.8Si0.2)N |
| 14 | Ti0.5Al0.5 | (Ti0.5Al0.5)N | 15 | W | WN |
| 15 | Ti0.5Al0.5 | (Ti0.5Al0.5)N | 15 | Mo0.9Si0.1 | (Mo0.9Si0.1)N |
| 16 | Ti0.5Al0.45Si0.05 | (Ti0.5Al0.45Si0.05)N | 15 | Mo0.9B0.1 | (Mo0.9B0.1)N |
| 17 | Ti0.5Al0.45Si0.05 | (Ti0.5Al0.45Si0.05)N | 15 | Mo0.5W0.5 | (Mo0.5W0.5)N |

| No. | Thickness nm | Number of layers* | Crystal structure | Hardness HV | Thickness of oxide film μm | Amount of wear μm |
|---|---|---|---|---|---|---|
| 1 | 20 | 120 | C | 2650 | 1.20 | 115.0 |
| 2 | 15 | 130 | C | 2700 | 1.15 | 109.0 |
| 3 | 15 | 85 | C | 2950 | 0.70 | 62.0 |
| 4 | 12 | 111 | C | 2900 | 0.65 | 61.0 |
| 5 | 10 | 136 | C | 3000 | 0.71 | 61.0 |
| 6 | 3 | 375 | C | 2900 | 0.66 | 74.0 |
| 7 | 1.5 | 857 | C | 2800 | 0.75 | 85.0 |
| 8 | 0.4 | 5000 | C | 2640 | 0.99 | 115.0 |
| 9 | 8 | 130 | C | 2950 | 0.67 | 68.0 |
| 10 | 8 | 130 | C | 2900 | 0.68 | 74.0 |

TABLE 9-continued

| 11 | 8 | 130 | C | 2870 | 0.55 | 56.0 |
| 12 | 8 | 130 | C | 3000 | 0.74 | 59.0 |
| 13 | 8 | 130 | C | 2970 | 0.51 | 64.0 |
| 14 | 8 | 130 | C | 2880 | 0.68 | 77.0 |
| 15 | 8 | 130 | C | 2900 | 0.55 | 53.0 |
| 16 | 8 | 130 | C | 3000 | 0.48 | 51.0 |
| 17 | 8 | 130 | C | 2890 | 0.49 | 60.0 |

*The number of sets each comprising a layer A and a layer B is given.

From Table 9, it can be seen that the coating film that satisfies the requirements of the present invention shows high hardness, small thickness of the oxide film formed by oxidation treatment, and the amount of wear during cutting test that is kept at a low level. In contrast, the coating film that does not satisfy the requirements of the present invention shows low hardness, poor oxidation resistance with thick oxide film or a significant amount of wear during cutting test. Specifically, samples Nos. 1, 2 and 8, where layer B is thicker than layer A, show low hardness, poor oxidation resistance and a significant amount of wear during cutting test.

EXAMPLE 8

Influence of relative density of the target on surface roughness and hardness of the coating was studied. Predetermined quantities of Al powder, Ti powder, Cr powder, W powder, Mo powder, Si powder and B powder that passed 100 mesh sieve were mixed. The mixture was used to make targets of various compositions shown in Tables 10 through 12 by the HIP process at a temperature of 500° C. under pressure of 100 MPa, the hot forging process at a temperature of 400° C. or the hot press process (sintering temperature 550° C.). Composition of the target was measured by X-ray fluorescence analysis.

With the target being set in the film forming apparatus shown in FIG. 4, coating film was formed by electrical discharge. Surface roughness and hardness of the coating thus formed were measured. Measurement of hardness was carried out similarly to Example 7. Results of the measurements are shown in Tables 10 through 12.

TABLE 10

| No. | Target manufacturing method | Composition of target (Atomic ratio) | | | | Relative density % | Film forming method | Surface roughness μm | Hardness HV |
|---|---|---|---|---|---|---|---|---|---|
| | | Cr | Al | B | Si | | | | |
| 21 | HIP | 0.35 | 0.65 | 0 | 0 | 95 | AIP | 0.13 | 2900 |
| 22 | HIP | 0.35 | 0.65 | 0 | 0 | 100 | AIP | 0.05 | 3000 |
| 23 | Hot forging | 0.35 | 0.65 | 0 | 0 | 85 | AIP | 0.35 | 2600 |
| 24 | Hot forging | 0.35 | 0.65 | 0 | 0 | 91 | AIP | 0.3 | 2700 |
| 25 | Hot forging | 0.35 | 0.65 | 0 | 0 | 95 | AIP | 0.12 | 3000 |
| 26 | Hot forging | 0.35 | 0.65 | 0 | 0 | 100 | AIP | 0.05 | 3100 |
| 27 | Hot press | 0.35 | 0.6 | 0 | 0.05 | 87 | AIP | 0.3 | 2650 |
| 28 | Hot press | 0.35 | 0.6 | 0 | 0.05 | 90 | AIP | 0.25 | 2750 |
| 29 | HIP | 0.35 | 0.6 | 0 | 0.05 | 95 | Sputter | 0.03 | 2900 |
| 30 | HIP | 0.35 | 0.58 | 0.07 | 0 | 100 | Sputter | 0.01 | 3000 |
| 31 | Hot forging | 0.35 | 0.58 | 0.03 | 0.04 | 85 | Sputter | 0.17 | 2700 |
| 32 | Hot forging | 0.35 | 0.58 | 0.03 | 0.04 | 91 | Sputter | 0.15 | 2800 |
| 33 | Hot forging | 0.35 | 0.58 | 0.03 | 0.04 | 95 | Sputter | 0.03 | 3000 |
| 34 | Hot forging | 0.35 | 0.58 | 0.03 | 0.04 | 100 | Sputter | 0.02 | 3050 |

TABLE 11

| No. | Target manufacturing method | Composition of target (Atomic ratio) | | | | Relative density % | Film forming method | Surface roughness μm | Hardness HV |
|---|---|---|---|---|---|---|---|---|---|
| | | Ti | Al | B | Si | | | | |
| 41 | HIP | 0.37 | 0.56 | 0 | 0.07 | 95 | AIP | 0.14 | 3000 |
| 42 | HIP | 0.37 | 0.56 | 0 | 0.07 | 100 | AIP | 0.05 | 3050 |
| 43 | Hot forging | 0.37 | 0.56 | 0 | 0.07 | 85 | AIP | 0.35 | 2750 |
| 44 | Hot forging | 0.37 | 0.56 | 0 | 0.07 | 91 | AIP | 0.31 | 2800 |
| 45 | Hot forging | 0.37 | 0.56 | 0 | 0.07 | 95 | AIP | 0.13 | 2950 |
| 46 | Hot forging | 0.37 | 0.56 | 0 | 0.07 | 100 | AIP | 0.05 | 3000 |
| 47 | Hot press | 0.37 | 0.55 | 0.04 | 0.04 | 87 | AIP | 0.3 | 2750 |
| 48 | Hot press | 0.37 | 0.55 | 0.04 | 0.04 | 90 | AIP | 0.25 | 2800 |
| 49 | HIP | 0.37 | 0.55 | 0.04 | 0.04 | 95 | Sputter | 0.03 | 3000 |
| 50 | HIP | 0.37 | 0.55 | 0.04 | 0.04 | 100 | Sputter | 0.01 | 3050 |
| 51 | Hot forging | 0.37 | 0.55 | 0.04 | 0.04 | 85 | Sputter | 0.17 | 2750 |
| 52 | Hot forging | 0.37 | 0.55 | 0.04 | 0.04 | 91 | Sputter | 0.15 | 2800 |
| 53 | Hot forging | 0.37 | 0.55 | 0.04 | 0.04 | 95 | Sputter | 0.03 | 3000 |
| 54 | Hot forging | 0.37 | 0.55 | 0.04 | 0.04 | 100 | Sputter | 0.02 | 3050 |

TABLE 12

| Target No. | manufacturing method | Composition of target (Atomic ratio) W | Mo | B | Si | Relative density % | Film forming method | Surface roughness μm | Hardness HV |
|---|---|---|---|---|---|---|---|---|---|
| 41 | HIP | 0.37 | 0.63 | 0 | 0 | 95 | Sputter | 0.15 | 2900 |
| 42 | HIP | 0.37 | 0.63 | 0 | 0 | 100 | Sputter | 0.06 | 2950 |
| 43 | Hot forging | 0.37 | 0.63 | 0 | 0 | 85 | Sputter | 0.4 | 2550 |
| 44 | Hot forging | 0.37 | 0.56 | 0 | 0.07 | 91 | Sputter | 0.3 | 2600 |
| 45 | Hot forging | 0.37 | 0.56 | 0 | 0.07 | 95 | Sputter | 0.15 | 2950 |
| 46 | Hot forging | 0.37 | 0.56 | 0 | 0.07 | 100 | Sputter | 0.05 | 3000 |
| 47 | Hot press | 0.37 | 0.55 | 0.04 | 0.04 | 87 | Sputter | 0.3 | 2600 |
| 48 | Hot press | 0.37 | 0.55 | 0.04 | 0.04 | 90 | Sputter | 0.25 | 270 |
| 49 | HIP | 0.37 | 0.55 | 0.04 | 0.04 | 95 | Sputter | 0.03 | 2850 |
| 50 | HIP | 0.37 | 0.55 | 0.04 | 0.04 | 100 | Sputter | 0.01 | 2950 |
| 51 | Hot forging | 0.37 | 0.55 | 0.04 | 0.04 | 85 | Sputter | 0.16 | 2550 |
| 52 | Hot forging | 0.37 | 0.55 | 0.04 | 0.04 | 91 | Sputter | 0.15 | 2600 |
| 53 | Hot forging | 0.37 | 0.55 | 0.04 | 0.04 | 95 | Sputter | 0.03 | 2950 |
| 54 | Hot forging | 0.37 | 0.55 | 0.04 | 0.04 | 100 | Sputter | 0.02 | 3050 |

From Tables 10 through 12, it can be seen that the coating films formed by using targets that have the relative density specified by the present invention have small surface roughness and high hardness. The coating films formed by using targets that do not have the relative density specified by the present invention, in contrast, have such problems as large surface roughness (which results in a significant amount of wear due to high frictional resistance during cutting operation) and insufficient hardness.

What is claimed is:

1. A hard coating excellent in wear resistance and oxidation resistance and made by stacking a layer A and a layer B that have different compositions, wherein
the layer A is one selected from a group consisting of:
(1) a hard coating having composition of $(Al_a,Cr_{1-a})(C_{1-e}N_e)$ satisfying the relations:

$0.25 \leq a \leq 0.7$ and $0.5 \leq e \leq 1$;

(2) a hard coating having composition of $(Al_a,Si_c,B_d,Cr_{1-a-c-d})(C_{1-e}N_e)$ satisfying the relations:

$0 < c+d \leq 0.2$, and $0 < c+d \leq 0.2$, and $0.5 \leq e \leq 1$; and (3) a hard coating having composition of $(Al_a,Si_c,B_d,Ti_{1-a-c-d})(C_{1-e}N_e)$ satisfying the relations:

$0.25 \leq a \leq 0.7$, $0 < c+d \leq 0.15$, and $0.5 \leq e \leq 1$;

(where a, c, d and e that represent atomic ratios of Al, Si, B and N, respectively)

and the layer B is a hard coating having composition of $(M_b,Si_c,B_d)(C_{1-e}N_e)$ where M represents W and/or Mo, satisfying the relations:

$0.8 \leq b \leq 1$, and $0 \leq c+d \leq 0.2$;

(where b, c, d and e that represent atomic ratios of M, Si, B and N, respectively)
wherein the layer A and the layer B are stacked one on another so as to satisfy the following relation (1):

$0.5\ (nm) \leq$ (Thickness of layer B) $\leq$ (Thickness of layer A)     (1).

2. The hard coating of claim 1, wherein the layer A is (1) a hard coating having composition of $(Al_a,Cr_{1-a})(C_{1-e}N_e)$ satisfying the relations:

$0.25 \leq a \leq 0.7$ and $0.5 \leq e \leq 1$.

3. The hard coating according to claim 1, wherein the layer A is (2) a hard coating having composition of $(Al_a,Si_c,B_d,Cr_{1-a-c-d})(C_{1-e}N_e)$ satisfying the relations:

$0.25 \leq a \leq 0.7$, $0 < c+d \leq 0.2$, and $0.5 \leq e \leq 1$.

4. The hard coating of claim 1, wherein the layer A is (3) a hard coating having composition of $(Al_a,Si_c,B_d,Ti_{1-a-c-d})(C_{1-e}N_e)$ satisfying the relations:

$0.25 \leq a \leq 0.7$, $0 < c+d \leq 0.15$, and $0.5 \leq e \leq 1$.

* * * * *

UNITED STATES PATENT AND TRADEMARK OFFICE
CERTIFICATE OF CORRECTION

PATENT NO. : 7,601,440 B2  Page 1 of 1
APPLICATION NO. : 12/362016
DATED : October 13, 2009
INVENTOR(S) : Kenji Yamamoto It is certified that error appears in the above-identified patent and that said Letters Patent is hereby corrected as shown below:

Column 35, Claim 1, line 44, should read:

-- $0.25 \leq a \leq 0.7$, --

Signed and Sealed this

Nineteenth Day of January, 2010

David J. Kappos
*Director of the United States Patent and Trademark Office*